United States Patent [19]

Cane

[11] Patent Number: 5,648,125

[45] Date of Patent: Jul. 15, 1997

[54] ELECTROLESS PLATING PROCESS FOR THE MANUFACTURE OF PRINTED CIRCUIT BOARDS

[76] Inventor: Frank N. Cane, 3058 Plumstead Way, San Jose, Calif. 95148

[21] Appl. No.: 558,900

[22] Filed: Nov. 16, 1995

[51] Int. Cl.$^6$ ............................................. C23C 14/02
[52] U.S. Cl. ..................... 427/534; 427/97; 427/98; 427/210; 427/259; 427/264; 427/265; 427/270; 427/272; 427/282; 427/304; 427/404; 427/443.1; 427/510; 427/535; 427/553; 427/576
[58] Field of Search ................... 427/97, 98, 305, 427/443.1, 535, 534, 576, 210, 404, 264, 259, 265, 270, 272, 282, 510, 553

[56] References Cited

U.S. PATENT DOCUMENTS

| | | | |
|---|---|---|---|
| 3,011,920 | 12/1961 | Shipley, Jr. | 117/213 |
| 3,532,518 | 10/1970 | D'Ottavio | 106/1 |
| 4,448,804 | 5/1984 | Amelio et al. | 156/630 |
| 4,515,829 | 5/1985 | Deckert et al. | 427/97 |
| 4,600,609 | 7/1986 | Leever et al. | 427/438 |
| 4,608,275 | 8/1986 | Kukanskis et al. | 427/98 |
| 4,634,468 | 1/1987 | Gulla et al. | 106/1.11 |
| 4,683,036 | 7/1987 | Morrissey et al. | 204/151 |
| 4,756,930 | 7/1988 | Kukanskis et al. | 427/97 |
| 4,759,952 | 7/1988 | Brasch et al. | 427/98 |
| 4,782,007 | 11/1988 | Ferrier | 430/313 |
| 4,863,758 | 9/1989 | Rhodenizer | 427/97 |
| 4,904,506 | 2/1990 | Burnett et al. | 427/443.1 |
| 5,213,841 | 5/1993 | Gulla et al. | 427/98 |
| 5,358,602 | 10/1994 | Sutcliffe et al. | 156/656 |
| 5,472,563 | 12/1995 | Kogawa et al. | 156/629.1 |
| 5,474,798 | 12/1995 | Larson et al. | 427/58 |

OTHER PUBLICATIONS

Roubal et al. (1989) Galvanotechnik 80:226–30 (No Month Avail.).

*Primary Examiner*—Bernard Pianalto
*Attorney, Agent, or Firm*—Klauber & Jackson

[57] ABSTRACT

There is disclosed a process for electroless plating of a conductive metal layer onto the surface of a non-conductive substrate, in which the substrate surface is prepared for receiving a coating of activator using conventional methods, and the coating of activator is applied by contacting the substrate surface with a stabilized sensitizing solution comprising ions of at least one Group VIII and IB transition metal, preferably palladium chloride, stannous ions in a molar concentration in excess of that of the transition metal ions, an acid, and a buffering salt; followed by contacting the sensitized substrate surface with a noble metal activating solution to catalyze the substrate surface for subsequent electroless plating. The sensitized and activated substrate is then contacted with an aqueous dry film photoresist, which is then imaged and developed to form a predetermined electrical circuit pattern, using conventional methods. The cleaned and imaged substrate is then immersed in an acidic electroless nickel metal depositing solution, for a time, at a concentration, and at a temperature sufficient to prepare the substrate for subsequent pattern electroplating, said acidic electroless metal depositing solution comprising ions of nickel, a complexing agent, a reducing agent capable of reducing said metal ions to a metallic state in an acidic medium, provided that said reducing agent does not include formaldehyde or a formaldehyde generating composition, one or more stabilizers, and water.

14 Claims, 2 Drawing Sheets

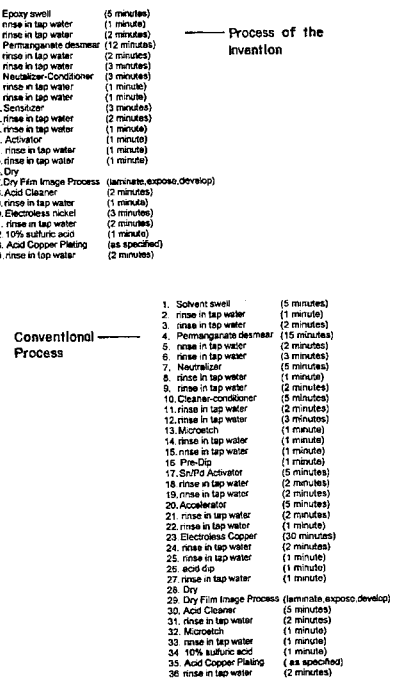

————— Process of the Invention

1. Epoxy swell                  (5 minutes)
2. rinse in tap water           (1 minute)
3. rinse in tap water           (2 minutes)
4. Permanganate desmear         (12 minutes)
5. rinse in tap water           (2 minutes)
6. rinse in tap water           (3 minutes)
7. Neutalizer-Conditioner       (3 minutes)
8. rinse in tap water           (1 minute)
9. rinse in tap water           (1 minute)
10. Sensitizer                  (3 minutes)
11. rinse in tap water          (2 minutes)
12. rinse in tap water          (1 minute)
13. Activator                   (1 minute)
14. rinse in tap water          (1 minute)
15. rinse in tap water          (1 minute)
16. Dry
17. Dry Film Image Process      (laminate, expose, develop)
18. Acid Cleaner                (2 minutes)
19. rinse in tap water          (1 minute)
20. Electroless nickel          (3 minutes)
21. rinse in tap water          (2 minutes)
22. 10% sulfuric acid           (1 minute)
23. Acid Copper Plating         (as specified)
24. rinse in tap water          (2 minutes)

Conventional ————— Process

1. Solvent swell                (5 minutes)
2. rinse in tap water           (1 minute)
3. rinse in tap water           (2 minutes)
4. Permanganate desmear         (15 minutes)
5. rinse in tap water           (2 minutes)
6. rinse in tap water           (3 minutes)
7. Neutralizer                  (5 minutes)
8. rinse in tap water           (1 minute)
9. rinse in tap water           (2 minutes)
10. Cleaner-conditioner         (5 minutes)
11. rinse in tap water          (2 minutes)
12. rinse in tap water          (3 minutes)
13. Microetch                   (1 minute)
14. rinse in tap water          (1 minute)
15. rinse in tap water          (1 minute)
16. Pre-Dip                     (1 minute)
17. Sn/Pd Activator             (5 minutes)
18. rinse in tap water          (2 minutes)
19. rinse in tap water          (2 minutes)
20. Accelerator                 (5 minutes)
21. rinse in tap water          (2 minutes)
22. rinse in tap water          (1 minute)
23. Electroless Copper          (30 minutes)
24. rinse in tap water          (2 minutes)
25. rinse in tap water          (1 minute)
26. acid dip                    (1 minute)
27. rinse in tap water          (1 minute)
28. Dry
29. Dry Film Image Process      (laminate, expose, develop)
30. Acid Cleaner                (5 minutes)
31. rinse in tap water          (2 minutes)
32. Microetch                   (1 minute)
33. rinse in tap water          (1 minute)
34. 10% sulfuric acid           (1 minute)
35. Acid Copper Plating         (as specified)
36. rinse in tap water          (2 minutes)

FIG. 1

| Conventional | Palladium | Palladium Sulfide | Carbon | Present Invention |
|---|---|---|---|---|
| Drill | Drill | Drill | Drill | Drill |
| Deburr | Deburr | Deburr | Deburr | Deburr |
| Desmear | Desmear | Desmear | Desmear | Desmear |
| Clean/Condition | Condition | Sensitize | Condition | Sensitize |
| *rinse* | *rinse* | *rinse* | *rinse* | *rinse* |
| Microetch | Microetch | Activate | Carbon Coat | Activate |
| *rinse* | *rinse* | *rinse* | *rinse* | *rinse* |
| Preactivate | Preactivate | Converter | Microetch | (deburr) |
| Activator/Catalyst | Activator | *rinse* | *rinse* | Dry |
| *rinse* | *rinse* | Enhancer | Anti-Tarnish | DRY FILM |
| Accelerator | Accelerator | *rinse* | DRY FILM | Acid Cleaner |
| *rinse* | *rinse* | Stabilizer | Acid Clean | *rinse* |
| Electroless Copper Plate | Dry | *rinse* | *rinse* | Electroless Nickel Plate |
| *rinse* | DRY FILM | Microetch | (Microetch) | *rinse* |
| Acid Dip | Acid Clean | *rinse* | *rinse* | Pattern Plate |
| *rinse* | (Microetch) | Dry | Pattern Plate | |
| Anti-Tarnish | *rinse* | DRY FILM | | |
| *rinse* | Pattern Plate | Acid Clean | | |
| Dry | | *rinse* | | |
| DRY FILM | | (Microetch) | | |
| Acid Clean | | *rinse* | | |
| *rinse* | | Pattern Plate | | |
| (Microetch) | | | | |
| *rinse* | | | | |
| Pattern Plate | | | | |

FIG.2

ELECTROLESS PLATING PROCESS FOR THE MANUFACTURE OF PRINTED CIRCUIT BOARDS

FIELD OF THE INVENTION

The present invention is in the field of multistep processes for the electroless plating of conductive metal coatings on selected portions of a non-conductive substrate surface. The final products of these processes are particularly printed circuit boards and related articles. In double-sided and multilayer printed circuit boards, it is necessary to provide conductive interconnection between and among the various layers of the board containing conductive circuitry. This is achieved by providing metallized, conductive through-holes in the board requiring electrical connection. The predominant method for providing conductive through-holes is by electroless deposition of metal on the non-conductive through-holes drilled or punched through the board.

Accordingly, the process of the present invention relates to electroless metallization of non-conductive through-hole surfaces in double-sided and/or multilayer printed circuit boards. The present invention is also in the field of processes which replace processes of the type described above, with processes that substitute other metallization techniques.

BACKGROUND OF THE INVENTION

There have long existed many methods for the application of a selected metal coating to a non-conductive, i.e., dielectric surface in order to produce printed circuit boards which will conduct an electrical current in accordance with the patterns of conductive metal coated on their surface. These methods have involved the following two basic steps: (1) treating the surface of the non-conductive substrate with an agent to make it catalytically receptive to electrolessly formed metal deposits; and (2) electrodepositing a plating metal over the electrolessly formed conductive metal deposits. The pattern of the printed circuit is achieved through the use of screen or photoresist imaging. The non-conductive substrate may initially be copper-clad or not; but most boards have copper cladding at the beginning of the process, which is later removed in the non-pattern areas. Such processes are, consequently, referred to as substractive.

In the typical processes relevant to printed circuit board manufacture, wherein through-hole metallization is employed, the catalytic material most often comprises palladium metal. The process of applying the catalytic material to the substrate surfaces typically involves contact of the substrate with a true or colloidal solution of palladium and tin compounds. See, e.g., U.S. Pat. Nos. 3,011,920 and 3,532,518. It is generally considered that the tin compounds act as protective colloids for the catalytic palladium. In most cases, the catalysis of the non-conductive substrate of the printed circuit board is followed by an "acceleration" step which exposes or increases exposure of the active catalytic species.

Following deposition of catalyst material on the non-conductive surfaces in the manner described, the surfaces are then contacted with an electroless metal depositing solution in which plating chemical reduction leads to the deposit of metal from the bath onto the catalyzed surface. The through-holes are usually plated with a copper reduction procedure known to the art as electroless copper plating, such as that described by Clyde F. Coombs, Jr. in *Printed Circuit Handbook*, 3rd Edition, McGraw-Hill Book Co., New York, N.Y., 1988, Chapter 12.5, which is incorporated herein by reference in its entirety.

Methods of the type described above, while apparently simple, have proven to be expensive and demanding of strict process controls. Further limitations on the use of these processes result from the chemical susceptibility of the electroless metal layer, and by the required use of very hazardous and toxic chemical agents. Efforts to overcome these disadvantages have met with only partial success in the past, and have brought with them their own disadvantages. Accordingly, in order to appreciate the significance of the improvements achieved by the present invention, it will be helpful to review beforehand the major features of current printed circuit board technology.

In a typical process for the manufacture of a single- or double-sided printed circuit board, suitable substrates generally comprise laminates consisting of two or more plates or foils of copper, which are separated from each other by a layer of non-conductive material. The non-conductive layer or layers are preferably an organic material such as epoxy resin impregnated with glass fibers. Holes are drilled or punched at appropriate locations on the board, providing side-to-side connections when metallized. Thereafter, the board is treated with a cleaning composition, typically alkaline, which removes soils and conditions the through-holes, followed by a slow acid etching treatment which is used for removal of copper surface pretreatments, oxidation, and presentation of uniformly active copper. Typical compositions for this microetching step are persulfates and sulfuric acid-hydrogen peroxide solutions. The board is next catalyzed with a neutral or acid solution of tin/palladium catalyst, which deposits a thin layer of surface-active palladium in the through-holes and on the surface of the board. Colloidal tin on the board surfaces and through-holes is removed by treatment with an accelerator composition. The board is then ready for electroless copper plating, which is typically carried out with an alkaline chelated copper reducing solution that deposits a thin copper layer in the through-holes and on the surfaces of the board. After acid-dipping, commonly with sulfuric acid, the board is metal plated with a conventional copper plating solution. It is more usual, however, to precede this metallization step with an imaging step.

In a process known as pattern plating, a dry film photoresist is applied to the board and then exposed to transfer the negative image of the circuit, after which it is developed to remove the unexposed portions. The resist coats the copper that is not part of the conductor pattern. Thickness of the copper pattern is increased by electrolytic copper plating. The imaged dry film resist is then removed, exposing unwanted copper, i.e., copper which is not part of the conductor pattern, and said unwanted copper is dissolved with a suitable etchant, e.g., ammoniacal copper or sulfuric/peroxide.

A multilayered printed circuit board is made by a similar process, except that pre-formed circuit boards are stacked on top of each other and coated with a dielectric layer. The stack is pressed and bonded together under heat and pressure, after which holes are drilled and plated in the above-described manner. However, one problem present with the manufacture of multilayer printed circuit board through-holes is that the drilling of the holes causes resin "smear" on the exposed conductive copper metal innerlayers, due to heating during the drilling operation. The resin smear may act as an insulator between the later plated-on metal in the through-holes and these copper innerlayers. Thus, this smear may result in poor electrical connections and must be removed before the plating-on operation.

Various alkaline permanganate treatments have been used as standard methods for desmearing surfaces of printed circuit boards, including the through-holes. Such permanganate treatments have been employed for reliably removing smear and drilling debris, as well as for texturing or micro-roughening the exposed epoxy resin surfaces. The latter effect significantly improves through-hole metallization by facilitating adhesion to epoxy resin. Other conventional smear removal methods have included treatment with sulfuric acid, chromic acid, and plasma desmear, which is a dry chemical method in which boards are exposed to oxygen and fluorocarbon gases, e.g., CF4. Generally, permanganate treatments involve three different solution treatments used sequentially. They are (1) a solvent swell solution, (2) a permanganate desmear solution, and (3) a neutralization solution. Typically, a printed circuit board is dipped or otherwise exposed to each solution, with a deionized water rinse between each of the three treatment solutions. When the desmearing process is continued, it results in exposure of about 0.5 mil on the top and bottom surface of the innerlayer copper, allowing it to protrude from the drilled through-hole, promoting better adhesion to the later-applied metallized layer.

DESCRIPTION OF THE PRIOR ART

Numerous U.S. and foreign patents and published applications have been issued and printed which disclose and teach different permanganate desmearing and/or neutralization compositions and methods. For example, U.S. Pat. No. 4,073,740 to Polichette et al. discloses a composition comprising water, permanganate ion and manganate ion, with a manganate/permanganate molar ratio of up to 1.2 to 1, and a pH of from 11 to 13. U.S. Pat. No. 4,515,829 to Deckert et al. discloses contacting through-hole walls with an aqueous alkaline permanganate solution, and thereafter a reducing agent solution. U.S. Pat. No. 4,592,852 to Courduvelis et al. teaches the use of an alkaline composition to improve the adhesion of plastics to electroless metal deposits. U.S. Pat. No. 5,015,339 to Pendelton et al. discloses contacting a substrate with an alkaline permanganate solution, and thereafter with a single-step permanganate neutralizer and conditioner composition.

Other teachings in the art have suggested different approaches. For example, U.S. Pat. No. 4,803,097 to Fraenkel et al. discloses first exposing the surfaces of a non-conductive substrate to an atmosphere of ozone, followed by a conditioning solvent of alcohols and strong bases, and then treatment with an oxidizing agent, e.g., permanganate. U.S. Pat. No. 4,152,477 to Haruta et al. suggests etching a butadiene composition to expose phenolic resin microcapsules in it, then sensitizing with palladium chloride. U.S. Pat. No. 4,448,804 to Amelio et at. teaches treatment with an acidic solution containing a multifunctional ionic copolymer which has good adhesion to the substrate surface. U.S. Pat. No. 5,268,088 to Okabayashi discloses the use of alkaline adhesion promoter solutions comprising aqueous alkali metal salts, e.g., KOH and NaOH. Glass fibers used to impregnate epoxy resin have a highly negative surface charge and repel negatively charged tin-palladium catalyst particles. U.S. Pat. No. 4,976,990 to Bach et al. discloses conditioning agents which improve adsorption of the activating material on the glass fiber, e.g., an organic silicon compound. U.S. Pat. No. 5,342,654 to Koizume et al. discloses a method for surface roughening boards made of polyphenylene sulfide resin by incorporating a specific resin therein and selectively dissolving away the specific resin at the surface.

Electroless plating systems based on palladium and tin chloride catalysts in acidic solutions have become widely used and reported in the art. U.S. Pat. No. 4,478,883 to Bupp et al. teaches that palladium seeding agent may be attracted to conductive metal, such as copper on the surface, resulting in smaller amounts of the palladium catalyst going to desired areas, e.g., when plating through-holes where copper may be present in internal planes of the substrate. U.S. Pat. No. 4,554,182 to Bupp et al further teaches replacing HCl with $H_2SO_4$, apparently eliminating a problem of resist blistering and line tailing. Efforts have been made to replace such highly acidic systems. U.S. Pat. No. 4,634,468 to Gulla et al. discloses a reduced catalytic metal fixed onto an organic suspending agent which serves as a protective colloid, and is preferably a water soluble polymer, e.g., polyacrylamide or polyvinyl pyrrolidone.

Since acidic solutions sometimes cause problems to develop in the copper layers of laminated circuit boards, modifications of the catalytic system have been developed, e.g., a single step method using a low pH colloidal suspension of both the tin sensitizer and the palladium activator, as disclosed in U.S. Pat. No. 3,011,920 to Shipley, Jr. and U.S. Pat. No. 3,532,518 to D'Ottavio. Another variation of the process is disclosed in U.S. Pat. No. 5,318,803 to Bickford et al., where the catalyzing step is carried out twice, based on redox exchange reactions.

The electroless metal coating, usually copper, functions to make the through-holes conductive for either further electroplating, or for full electroless deposition to the full thickness desired, and to the full surface circuit pattern desired. Where the substrate is non-copper clad initially, the function of the electroless copper is to make the surface conductive as well as the through-holes. The electroless plating step has received abundant treatment in the art. U.S. Pat. No. 4,904,506 to Burnett et al. discloses electroless copper plating in which two successive layers of copper are plated onto the substrate from an alkaline electroless bath, the second bath having higher cyanide ion and $O_2$ concentrations than the first. Current trends in printed circuit board technology indicate that smaller, higher-aspect-ratio holes will become the state of the art. Recently, there has been a substantial decline in the average size of the through-hole in manufactured boards, from 0.030" and larger, to smaller diameters. While the standard diameter remains 0.028", this is expected to decrease to 0.018" in the coming decade. Such trends place increasing pressure on methodologies for producing printed circuit boards with regard to the always difficult task of properly plating the through-holes.

Direct plating is disclosed in U.S. Pat. No. 4,810,333 to Gulla et al where the non-conductive substrate is treated with an absorbed colloid surface coating which is then converted into a resistant conversion coating before direct electroplating is carried out. The requirement for relatively high current densities limits this process to plating larger through-holes. Another limitation of past methods has been their lack of adaptability to pattern plating circuit board construction techniques now in use, which are often referred to as photoresist methods. U.S. Pat. No. 4,089,686 to Townsend discloses such a method using a photopolymerizable composition. U.S. Pat. No. 4,948,707 to Johnson et al. discloses a permanent resist material employed over the catalyst layer in a predetermined pattern. However, the layer of catalyzing material beneath the resist layer tends to cause current leakage between circuit lines in close proximity to each other, e.g., in high density circuits. It is taught to insulate the catalytic particles by employing a homogeneous colloidal dispersion of palladium/tin particles, which must then be activated by application of a conventional accelerating solution.

The use of a post-activation or acceleration step prior to the final step of electrodeposition has become widespread. The purpose of this step is to render the activating species deposited in the activation step as "active" as possible prior to immersing the board into the electroless copper bath. Typically, the activating species is palladium, and in order to prevent the palladium from readily oxidizing to a non-activating form, it is combined with from 50 to 100 times as many tin atoms in the stannous state. The post-activation composition, e.g., a strongly acidic or strongly basic solution, removes some of the tin atoms surrounding the palladium, thereby creating greater access to the catalyzing palladium by the electroless copper plating solution. Some of the tin and palladium atoms are removed and become dispersed in the post-activation solution, where they combine to form a new and more active species which quickly initiates electroless deposition. The post-activation treatment also serves the function of solubilizing the hydroxides of tin which are formed during the rinse steps which follow activation. The hydroxides of tin form a gelatinous coating on the palladium metal activator particles, interfering with their proper functioning.

The post-activation or accelerator solutions require close monitoring of their concentrations, treatment times and temperatures, agitation, and accumulating levels of tin and copper, in order to avoid excess removal of tin and palladium. U.S. Pat. No. 5,342,501 to Okabayashi teaches that an accelerator solution can also be a mildly basic or alkaline bath incorporating a small quantity of copper ions. U.S. Pat. No. 4,608,275 to Kukanskis et al. discloses agents which oxidize the protective stannous tin and activate the palladium catalyst, e.g., sodium chlorite, hydrogen peroxide, potassium permanganate, and sodium perborate, and suggests use therewith of an electroless nickel bath. In some processes, flash plating is necessary to permit plating after the imaging process, since the activation systems have not been able to withstand this procedure. In order to eliminate the need for such flash plating, an improved process is disclosed in U.S. Pat. No. 5,358,602 to Sutcliffe and Conrod, where the substrate is treated with a conditioner, an activator solution, an accelerator, a neutralizer, and then an etchant.

BRIEF DESCRIPTION OF THE DRAWINGS

FIG. 1 is a schematic representation in table form of the steps in the printed circuit board manufacturing process of the present invention, as compared to the steps which characterize the conventional electroless plating process for making printed circuit boards.

FIG. 2 is a schematic representation in table form of the steps in the printed circuit board manufacturing process of the present invention, as compared to the steps which characterize the conventional processes of: (1) electroless plating; (2) direct plating using (a) palladium, and (b) palladium sulfide; and (3) carbon/graphite, for making printed circuit boards.

SUMMARY OF THE INVENTION

It is an object of the present invention to provide an improved electroless process for applying a conductive metal layer to a non-conductive material, especially the through-hole walls of printed circuit boards.

It is a further object of the present invention to provide a combined permanganate desmearing and preplate step wherein the neutralization treatment of the desmearing step and the conditioning treatment of the preplating step are combined into a single operation.

It is also an object of the present invention to provide a more economical and environmentally safer process for applying a conductive metal layer to the surfaces of non-conductive layers of printed circuit boards than is presently available with permanganates/electroless processes currently in use.

It is an object of the present invention to provide a process for permanganate desmearing and preplating operations for printed circuit boards, wherein the external layer circuit pattern is formed by the aqueous dry film photoresist steps of lamination, exposure and development, prior to the electroless metal deposition on the through-hole walls.

A further object of the present invention is to provide an improved method of manufacturing printed circuit boards wherein selective electroless metal deposition of through-holes is achieved by use of the preplating operation and the dry film circuit image operation.

A still further object of the present invention is to define a process for the manufacture of printed circuit boards in which the board through-holes are provided with a complete and adherent coating of conductive metal.

Additional objects and advantages of the present invention will be set forth in part in the instant specification, and in part will be obvious herefrom or may be learned in carrying the present invention into practice, all of which will be realized and attained by means of the instrumentalities and combinations pointed out in the appended claims.

Thus, in accordance with the present invention there is provided a process for electroless plating of a conductive metal layer onto the surface of a non-conductive substrate, comprising:

a) preparing said substrate surface for receiving a coating of activator using conventional methods;

b) applying a coating of activator comprising contacting said substrate surface with a stabilized sensitizing solution comprising ions of at least one Group VIII and IB transition metal, stannous ions in a molar concentration in excess of that of said transition metal ions, an acid, and a buffering salt; followed by contacting said sensitized substrate surface with a noble metal activating solution to catalyze said substrate surface for subsequent electroless plating; and c) immersing said sensitized and activated substrate in an acidic electroless nickel metal depositing solution, for a time, at a concentration, and at a temperature sufficient to prepare said substrate for subsequent pattern electroplating, said acidic electroless metal depositing solution comprising ions of nickel, a complexing agent, a reducing agent capable of reducing said metal ions to a metallic state in an acidic medium, provided that said reducing agent does not include formaldehyde or a formaldehyde generating composition, one or more stabilizers, and water.

The above-described electroless plating process is further provided wherein said conventional method of preparing said substrate surface for receiving a coating of activator is an alkaline permanganate treatment or plasma desmearing method; in the sensitizing solution the Group VIII or IB ion is palladium, preferably palladium chloride, the stannous ions are stannous chloride, the acid is hydrochloric acid, and the buffering salt is sodium chloride; the noble metal activating solution comprises palladium, preferably palladium chloride, and hydrochloric acid; in the acidic electroless nickel metal depositing solution the complexing agent comprises sodium acetate or succinic acid, the reducing agent comprises sodium borohydride or dimethylamineborane, and the stabilizer is lead acetate.

In accordance with the present invention there is further provided another embodiment consisting of a process for making a single- or double-sided, or multilayer printed circuit board comprising one or more layers of a non-conductive substrate and one or more through-holes, and a predetermined, conductive pattern in one or more sides or layers of said non-conductive substrate, comprising:

a) drilling said through-holes where necessary, deburring and desmearing said through-holes, and optionally cleaning and conditioning said substrate and said through-holes using conventional methods;

b) applying a coating of activator comprising contacting said substrate surface with a stabilized sensitizing solution comprising ions of at least one Group VIII and IB transition metal, stannous ions in a molar concentration in excess of that of said transition metal ions, an acid, and a buffering salt; followed by contacting said sensitized substrate surface with a noble metal activating solution to catalyze said substrate surface for subsequent electroless plating;

c) contacting said sensitized and activated substrate with an aqueous dry film photoresist, which is then imaged and developed to form a predetermined electrical circuit pattern, using conventional methods;

e) contacting said sensitized, activated and imaged substrate with an acidic cleaning solution in accordance with conventional methods; and f) immersing said cleaned and imaged substrate in an acidic electroless nickel metal depositing solution, for a time, at a concentration, and at a temperature sufficient to prepare said substrate for subsequent pattern electroplating, said acidic electroless nickel metal depositing solution comprising nickel ions, a complexing agent, a reducing agent capable of reducing said metal ions to a metallic state in an acidic medium, provided that said reducing agent does not include formaldehyde or a formaldehyde generating composition, one or more stabilizers, and water.

The above-described electroless plating process is further provided wherein said desmearing comprises an alkaline permanganate treatment or plasma desmearing method; said optional, conventional cleaning and conditioning method for said substrate and through-holes comprises treatment with butyl Carbitol®, i.e. diethylene glycol monobutyl ether, and glycol ethers; in the sensitizing solution the Group VIII or IB ion is palladium, preferably palladium chloride, the stannous ions are stannous chloride, the acid is hydrochloric acid, and the buffering salt is sodium chloride; the noble metal activating solution comprises palladium, preferably palladium chloride, and hydrochloric acid; in the acidic electroless nickel metal depositing solution the complexing agent comprises sodium acetate or succinic acid, the reducing agent comprises sodium borohydride or dimethylamineborane, and the stabilizer is lead acetate; and said acidic cleaning solution comprises sulfuric acid.

In accordance with the present invention there is provided a process for electroless plating of a conductive metal layer onto the surface of a non-conductive substrate, comprising:

a) contacting said substrate with a cleaning and conditioning composition comprising butyl Carbitol® and glycol ethers;

b) contacting said substrate surface with an alkaline permanganate solution for a time, at a concentration, and at an elevated temperature sufficient to prepare said substrate surface for a metal layer to be subsequently applied by electroplating;

c) contacting said substrate surface with an aqueous neutralizing and conditioning solution comprising: water, hydrogen peroxide, at least one acid sulfate compound, and at least one cationic surfactant;

d) contacting said substrate surface with a stabilized sensitizing solution comprising ions of at least one Group VIII and IB transition metal, stannous ions in a molar concentration in excess of that of said transition metal ions, an acid, and a buffering salt;

e) contacting said sensitized substrate surface with a noble metal activating solution to catalyze said substrate surface for subsequent electroless plating;

f) contacting said sensitized and activated substrate with an aqueous dry film photoresist, which is then imaged and developed to form a circuit pattern;

g) contacting said sensitized, activated and imaged substrate with an acidic cleaning solution to neutralize and remove residuals from said dry film developer; and h) immersing said cleaned and imaged substrate in an acidic electroless metal depositing solution, for a time, at a concentration, and at a temperature sufficient to prepare said substrate for subsequent pattern electroplating, said acidic electroless metal depositing solution comprising: ions of nickel, a complexing agent, a reducing agent capable of reducing said metal ions to a metallic state in an acidic medium, provided that said reducing agent does not include formaldehyde or a formaldehyde generating composition, one or more stabilizers, and water.

The above-described electroless plating process is further provided wherein, in the sensitizing solution the Group VIII or IB transition metal ion is one or more members selected from the group consisting of manganese, iron, cobalt, nickel, copper, palladium, platinum, silver and gold, preferably palladium, more preferably palladium chloride; the stannous ions are stannous chloride, the acid is hydrochloric acid, and the buffering salt is sodium chloride; the noble metal activating solution comprises palladium, preferably palladium chloride, and hydrochloric acid; in the acidic electroless nickel metal depositing solution the complexing agent comprises sodium acetate or succinic acid, the reducing agent comprises sodium borohydride or dimethylamineborane, and the stabilizer is lead acetate; and said acidic cleaning solution comprises sulfuric acid.

As the artisan will appreciate, the above steps and procedures are advantageously carried out with one or more steps of washing, i.e., rinsing, preferably with deionized water, after every step, where it is desired to remove from the substrate surface any of the materials or compositions which have come into contact with said substrate surface during the preceding step. The rinsing step assures that none of these materials or compositions with interfere with the procedures and applications of the succeeding step.

The above process is especially useful for electroless plating of a conductive metal layer to the surface of a nonconducting substrate, where said substrate is a printed circuit board, particularly a two-sided or multilayered board containing a number of through-holes to be plated. Use of the process of the present invention for that purpose involves particularly the metallization of the through-hole surfaces wherein the through-hole surfaces are sensitized and activated prior to the application of an aqueous dry film photoresist, and then contacted with electroless metal depositing bath. The process of the present invention results in complete through-hole coverage with metal and, importantly, a metal coating which remains strongly adherent and retains its deposited integrity in the through-hole during all phases of subsequent manufacture and use of the circuit board.

In accordance with the present invention there is further provided another embodiment consisting of a process for making a printed circuit board comprising one or more layers of a non-conductive substrate and one or more through-holes, and a predetermined, conductive pattern on one or more sides of said non-conductive substrate, comprising:

a) treating said substrate to prepare it for subsequent processing, comprising contacting said substrate with one or more conventional cleaning and conditioning solvents; contacting said conditioned substrate with a conventional oxidizing and etching solution which completes the cleaning of said substrate surface and etches said dielectric surface and said copper surface in order to enhance adhesion of material subsequently deposited thereon; contacting the conditioned and etched substrate with a conventional neutralizing and conditioning solution;

b) sensitizing the conditioned, etched and neutralized surface of said substrate, comprising contacting said substrate with the first component of a two component sensitizing and activating system, which is a stabilized sensitizing solution comprising ions of at least one Group VIII and IB transition metal, stannous ions in a molar concentration in excess of that of said transition metal ions, an acid, and a buffering salt;

c) imaging the desired circuit pattern on the sensitized substrate in a dry process, comprising applying a photopolymerizable layer to the sensitized substrate; imaging said photopolymerizable layer by masking the areas which are to form said desired circuit pattern; developing the polymerized and unpolymerized image areas of the circuit pattern thus formed by removing the unpolymerized material from the masked areas; and cleaning said desired circuit pattern and through-holes;

d) completing the activation of the surface of the imaged substrate, comprising contacting said substrate with the second component of the two component sensitizing and activating system, which is a noble metal activating solution;

e) contacting said sensitized, imaged and activated substrate with an electroless nickel plating bath to produce metallization of the imaged areas of said substrate; and f) depositing one or more further metal layers to form a pattern plated non-conductive substrate printed circuit board having the desired predetermined, conductive pattern.

The present invention further relates to the process of making a printed circuit board on a copper-clad non-conductive substrate as described above in which the non-conductive substrate has one or more through-holes therein which are also plated by metal as part of the pattern plating. The non-conductive substrate may already have one or more through-holes therein, created separately at another time or location, when said process begins. However, there is also included the situation wherein said substrate has no through-holes, and one or more through-holes are made in the non-conductive substrate at the time said process begins by drilling, punching, by means of a high intensity laser beam, or other means which will create through-holes having a desired diameter, followed by a step of deburring. Finally, there is included as well the case where both situations apply, i.e., where through-holes already exist in the non-conductive substrate at the time the process begins, but it is determined at that time that additional holes are required. These can be made before the process begins so that they will be metallized along with the pre-existing holes. There is also provided the above-described process wherein there is optionally included before the pattern plating step, the step of contacting said imaged and metalized substrate with an acidic solution to provide pH stability and compatibility with the subsequent plating step.

In accordance with the present invention, there is provided an improvement in known processes for manufacturing printed circuit boards of the double-sided or multilayered type in which a non-conductive substrate is provided with predetermined conductive circuit patterns on one or two sides or several layers thereof, and through-holes are provided through said substrate(s) which, when metallized provide a conductive interconnection between the conductive circuit patterns on one or both sides or several layers of said substrate(s); said known processes including the steps of cleaning and conditioning, oxidizing and etching, microetching, then neutralizing said substrate and through-hole surfaces; followed by activation, acceleration, electroless copper plating, cleaning, and then imaging; the improvement comprising eliminating the microetching step, eliminating the acceleration step, carrying out the imaging step before electroless metal plating, dividing the activating step into separate sensitizing and activating procedures, replacing the electroless copper plating step with an electroless nickel plating step, and eliminating the cleaning step after electroless metal plating; so that the process of the present invention comprises the following novel series of steps: depositing on the substrate and through-hole surfaces prepared in accordance with conventional procedures, except for microetching, as the first component of a two component sensitizing and activating system, a sensitizing solution comprising ions of at least one Group VIII and IB transition metal, stannous ions in a molar concentration in excess of that of said transition metal ions, an acid, and a buffering salt; applying a dry, photopolymerizable film to the entire surface of the sensitized substrate(s), irradiating said surface with masking of the areas which are to form the predetermined conductive circuit patterns including through-holes, and developing the image of the circuit pattern thus formed by removing the unpolymerized material from the masked areas; cleaning said exposed circuit pattern including through-holes, and then depositing thereon as the second component of said two component sensitizing and activating system, a transition metal sensitizing solution; contacting said activated circuit pattern including through-holes, with an electroless nickel plating bath which metallizes said circuit pattern and through-holes comprising ions of nickel, a complexing agent, a reducing agent capable of reducing said nickel ions to a metallic state in an acidic medium, provided that said reducing agent does not include formaldehyde or a formaldehyde generating composition, one or more stabilizers, and water; contacting the imaged and metalized substrate with an acidic solution to provide pH stability and compatibility with the subsequent plating step; and depositing one or more further metal layers to form the desired predetermined, conductive circuit pattern.

There is further provided the improvement in known processes for manufacturing printed circuit boards of the double-sided or multilayered type, essentially as recited above, but wherein the improvement comprises having the step of depositing as the second component of said two component sensitizing and activating system, a noble metal activating solution, follow the step of sensitizing, separated therefrom only by a rinsing step.

In accordance with the present invention there is further provided a number of novel compositions and formulations useful for carrying out each, or several, or all of the steps of the processes of the present invention summarized above. These may be provided individually or together in kit form, along with instructions and procedures for carrying out the specific step to which that formulation or composition relates. For example, for use in the first step, i.e., contacting the non-conductive substrate surface with a conditioning solvent which cleans said surface, there is provided a:

Hole Preparation Formulation comprising butyl carbitol and glycol ethers, along with instructions concerning the recommended time and temperature ranges for the cleaning step, as well as various conditions to observe as indicators of the completeness and effectiveness of the cleaning step. For use in the step of contacting the non-conductive substrate surface with an alkaline permanganate solution, there is provided a:

Permanganate Etch Formulation comprising potassium permanganate and sodium hydroxide at a pH of 13.0, along with instructions concerning the recommended time, concentration, pH, and elevated temperature needed to prepare said substrate surface for a metal layer to be subsequently applied by electroplating. For use in the step of contacting the non-conductive substrate surface with an aqueous neutralizing and conditioning solution, there is provided a:

Neutralizer-Conditioner Formulation comprising water, hydrogen peroxide, sodium bisulfate, and a multifunctional ionic copolymer, along with instructions for maintaining a suitably low pH in order to keep the viscosity of the ionic copolymer relatively low to facilitate application. For use in the step of contacting the non-conductive substrate surface with a stabilized sensitizing solution, there is provided a:

Sensitizer Formulation comprising palladium chloride, stannous chloride, sodium chloride, and water, along with instructions concerning the time and temperature ranges recommended for carrying out the step, as well as the importance of the rinsing step to obtaining the required stannous complex coating on the non-conductive substrate surface, as well as the through-holes therein. For use in the step of contacting the sensitized substrate surface with a noble metal activating solution to catalyze said substrate surface for subsequent electroless plating, there is provided an:

Activator Formulation comprising palladium chloride and hydrochloric acid, along with instructions regarding the optimum temperature and time conditions for the step which are necessary to obtain an activated surface. For use in the step of contacting the sensitized and activated substrate with an aqueous dry film photoresist, there is provided a:

Dry Film material consisting of Dynachem HG from Morton International, along with instructions regarding the proper temperature conditions, line speed, and waiting time necessary to prepare a dry film photoresist. For use in the step of imaging said photoresist, there is provided instructions regarding the appropriate range of intensities for the activating energy and the recommended waiting time. For the step of developing said photoresist to form a circuit pattern, there is provided a developing formulation consisting of a 0.85% solution of sodium carbonate, Dynachem KB1-A Developer, along with instructions regarding the required temperature range and spray chamber operation. For use in the step of contacting said the sensitized, activated and imaged substrate with an acidic cleaning solution to neutralize and remove residuals from the dry film developer, there is provided an:

Acid Cleaner Formulation comprising sulfuric acid and surfactants, along with instructions regarding the temperature and time ranges necessary to achieve adequate cleaning of the surface. For use in the step of immersing the cleaned and imaged substrate in an acidic electroless metal depositing solution, there is provided an:

Electroless Nickel Formulation comprising nickel sulfate; a reducing agent selected from sodium borohydride and dimethylamineborane; a stabilizer, and one or more complexing agents for the metal which prevent its precipitation from solution; along with instructions regarding the time, concentration, and temperature needed to prepare said substrate for subsequent pattern electroplating. For use in the final step of metal plating with a conventional electrolytic bath, there is provided an:

Acid Copper Formulation comprising copper sulfate and sulfuric acid, along with instructions concerning the concentrations of the bath components and the ranges of electric current and time which are required to produce the final metal plating which is desired.

Use of any of the above processes of the present invention results in a number of advantages over processes currently in use for manufacturing printed circuit boards. These advantages include, among other, the following: (1) the conventional three-step treatment entailing application of a pre-activator, a palladium/tin activator, and an accelerator, as required in the electroless copper plating procedures of the prior art, has been replaced in the processes of the present invention by a more economical and efficient two step sensitizing and activation procedure, without the need for an acceleration step; (2) the processes of the present invention involve fewer procedural steps and shorter process times than are required by conventional electroless processes; (3) the processes of the present invention are able to provide the type of uniform thickness of electroless plated metal on the through-hole walls of printed circuit boards which have long been sought with prior art processes, but never achieved to the same degree as with the present invention; (4) the physical, especially thermal characteristics of the adhesion of the electroless plated metal coatings on the through-hole walls achieved with the processes of the present invention meet or exceed IPC specifications; and (5) the processes of the present invention permit application of the dry film photoresist to the printed circuit board substrate prior to contacting it with an electroless metal depositing bath, which in turn allows for selective metallization of the through-holes and printed circuit patterns on said board.

DETAILED DESCRIPTION OF THE INVENTION

The present invention provides an improved process for through-hole metallization, and thus for the manufacture of printed circuit boards having enhanced quality and performance. The processes of the present invention are applicable to the treatment of a wide variety of non-conductive substrates. The terms "dielectric substrate" and "non-conductive substrate" as used herein mean an article having at least a portion of its surface inadequately conductive for direct electroplating. The dielectric or non-conductive substrate must be in contact with a metal surface, which can be a part of the substrate, or which can be placed in contact with the substrate for electroplating. In their more particular and preferred sense, the terms refer to a printed circuit board base material such as a copper clad epoxy or phenol resin sheet.

The non-conductive substrate itself may be made from a wide variety of non-conductive materials, including synthetic resins such as thermoplastic, thermosetting and elastomeric polymers, and glass. The substrate is usually a composite material, e.g., epoxy-glass, phenolic-paper, or polyester-glass; and typical composites used in circuit board manufacturing include polyimides for flexible circuitry or high-temperature applications; paper/phenolic which can be readily punched: NEMA grade FR-2; paper/epoxy which has better mechanical properties than the paper/phenolic: NEMA grade FR-3; glass/epoxy and woven glass fabric which have good mechanical properties: NEMA grade FR-4, FR-5; and random glass/polyester which is suitable for some applications: NEMA grade FR-6. Typical thermosetting polymeric materials which are suitable include polyepoxides; phenolic resins; aminoplastics; unsaturated polyesters; polyimides; and polyamides. Preferred thermosetting polymeric materials include the epoxy resins; phenolic resins, e.g., copolymers of phenol, resorcinol and cresol; and polyimides. The non-conductive substrates can be molded from such polymeric materials additionally containing fillers and/or reinforcing agents, such as glass filled epoxy or phenolic base materials. Other additives which may be present in the polymer include natural fibers such as cotton, paper and cellulose; synthetic fibers; carbon black; powdered alumina; fine silica particles; wax and so forth, used as fillers, pigments, reinforcing agents, mold release agents, and so forth. Suitable thermoplastic polymeric materials include polyolefins, such high and low density polyethylene, polypropylene, polyfluoroethylene, ethylene-propylene copolymers and the like; polyacetals; polyvinylchloride and copolymers thereof; polyvinylacetate; polysulfones; polysulfides including polyalkylene sulfides and polyarylene sulfides; polystyrenes and acrylonitrile-butadiene-styrene (ABS) copolymers; polyamides such as poly(hexamethylene adipamide), polycaprolactam, poly(hexamethylene sebacamide), and poly(undecamide); polyimides; polyester-imides; polyetherimides; polycarbonates; polyestercarbonates; polyphenylene oxide; polyacrylics such as poly (methacrylate), polyacrylic acid, and polyacrylonitrile; cellulose esters; polyurethanes; and polyamideimides. Preferred thermoplastic polymeric materials are polyolefins, e.g., polypropylene; polysulfones; polycarbonates; and ABS copolymers. Examples of useful elastomers are natural and synthetic rubbers; silicone rubbers; polyurethane elastomers; and nitrile rubbers. Preferred elastomers are nitrile rubbers. The preferred material from which to fabricate the non-conductive substrate used in the process of the present invention is a glass fiber filled epoxy resin.

Where the non-conductive substrate has one or more through-holes therein, which is almost always the case, the conventional and most expedient practice is to create these holes in the substrate by drilling or punching them, since they must be made to conform to a particular set of specifications for a manufacturing run that will probably be different for the next run. The drilling is also carried out through the copper sheet which is typically laminated to the non-conductive substrate, and may be accomplished by a number of means. It is possible to use high intensity laser beams to accomplish this task, since these are fast, can be quickly reprogrammed and repositioned, and create the desired holes without significant amounts of debris. These drilling procedures can often create burrs and other irregularities surrounding the holes in the non-conductive substrate surface which will seriously interfere with the ultimate plating process, and must, therefore, be removed. This is accomplished during conventional deburring steps, which may be carried out by sand or vapor blasting.

The processes of the present invention do not require any change in the drilling parameters for double-sided and multilayer substrates, since said processes are capable of substantially minimizing or eliminating such smear and innerconnect defects. The widely-used alkaline permanganate desmear step is integrated into the rest of the process of the present invention. Neutralization of manganese and manganate residues and hole wall conditioning are combined into a single conditioning process step which influences the coverage and adhesion of the deposit to epoxy resin glass topographies. The process of the present invention is also adaptable to plasma etchback/desmear methods.

Where a copper layer or foil is utilized with the non-conductive substrate, as is usually the case, it may be applied in a number of ways. For example, a copper sheet having a roughened surface may be laminated onto the surface of the non-conductive substrate by pressing the roughened surface of the copper sheet against said surface. The thickness of the copper sheet or foil will vary in between about 17.5 μm (0.7 mils, 0.5 oz/ft$^2$) and about 70 μm (2.8 mils, 2 oz/ft$^2$), although typical thicknesses are more commonly from 23 μm to 28 μm.

A number of conventional steps which are employed in various processes for manufacturing printed circuit boards may optionally be used with the process of the present invention without departing from the scope thereof. For example, in order to prepare the non-conductive substrate for the subsequent processing to which it will be subjected, it may contacted with a cleaning composition which cleans the surface of the substrate and enhances the effectiveness of the treatment in the succeeding step. The purpose of the cleaning step is to remove soil and light oils from the copper foil and the through-holes, remove stains and heat-treatment oxides from the copper foil, roughen the slight smear from drilling, and remove impacted drilling debris from the through-holes. The tailings and debris from the drilling and deburring steps must be completely removed. It is possible to use an acidic agent selected from sulfuric acid, chromic acid, hydrochloric acid, hydrofluoric acid, nitric acid, and the like, at sufficiently high concentration to achieve the cleaning objective. In the event of such use, it is preferred to use an aqueous sulfuric acid solution comprising from about 5% to about 20% by volume of concentrated sulfuric acid.

Another desirable treatment step which may optionally be employed is that which employs a conditioning solvent, sometimes referred to as a solvent swell solution. The function of the conditioner is to super-wet the non-conductive substrate, and in some cases to provide the substrate surface with a uniformity of polarity such that the later adsorption of activator is more easily facilitated. The conditioning solvent also prepares the non-conductive substrate by opening up the surface of the polymer material from which the substrate is made in order to improve the effectiveness of the succeeding treatment with an oxidizing and etching agent. The conditioning or solvent swell composition for use in the present invention is preferably a mixture of (1) butyl Carbitol®, (2) other alkyl ethers of Carbitol®, or (3) Carbitol® itself, and (4) various alkyl glycol ethers. The conditioning treatment step is carried out at elevated temperatures, preferably from about 100° F. to about 190° F., preferably from about 130° F. to about 170° F., and most preferably about 150° F. The length of time during which the non-conductive substrate is immersed in the conditioning solution will depend on the type and concentration of the particular conditioning agent used, as well as the temperature at which the conditioning solution is maintained. Notwithstanding, it has been found that a treatment time of from about 3 mins to about 8 mins, preferably from about 4 mins to about 7 mins, and most preferably about 5 mins, will suffice to provide the intended results. It is possible to combine the cleaning and conditioning compositions, although separate steps are generally more effective. Rinsing after this step is very important, and insufficient water and water at too low a temperature should be avoided.

It is usually preferable to utilize an agitating device with which to move the non-conductive substrate about in the conditioning system in which it is immersed, since this will assure access by the conditioning agent to all parts of the non-conductive substrate surface, as well as enhance the rate of the reactions which are taking place. Such an agitating device can be selected from a number of different types available on the market. A simple push/pull device provides satisfactory results with the various treatments steps of the present invention, including the conditioning step. An agitation rate of one push/pull cycle per minute of treatment time is usually sufficient to provide the desired results.

Following such a conditioning step as that described above, the non-conductive substrate should be rinsed, usually with deionized water, or water of sufficient purity that its impurities, by reason of type or concentration, will not interfere with the remaining steps in the process. Such a rinse step should follow most of the steps in the process of the present invention, for the reasons just stated. In the case of the conditioning step, the rinsing is carried out by a conventional power wash at ambient temperatures, for a period of time ranging from about 0.5 min to about 1.5 mins, preferably about 1 min.

The next step, which is preferred for use in the present invention, comprises contacting the substrate, conditioned as described above, with an alkaline permanganate solution in order to desmear drilling resin smear on the copper innerlayers of multilayer boards, as well as to microroughen epoxy non-conductive materials where these comprise the non-conductive substrate. The preferred alkaline permanganate solution is an oxidizing and etching solution which completes the cleaning of the substrate surface and etches that surface, as well as the copper surface, in order to enhance the adhesion of material subsequently deposited thereon. By etching the epoxy or other polymer material surfaces of the non-conductive substrate, the oxidizing and etching solution enhances plated through-hole adhesion, minimizing through-hole wall pull away and resin recession associated with thermal stress. The alkaline permanganate solution preferably has a pH in excess of about 10, and preferably in excess of about 13. A preferred alkaline permanganate solution comprises, e.g., (1) potassium permanganate and (2) sodium hydroxide. In addition to very high pH conditions, e.g., about 13.5, harsh reaction conditions are preferably employed as well, with the permanganate solution being maintained at an elevated temperature, preferably in excess of about 140° F., and preferably ranging between about 165° F. and about 200° F., and most preferably about 175° F. The immersion time for the non-conductive substrate in the permanganate solution will vary from about 4 to about 20 mins, and preferably varies between about 8 and about 16 mins, and most preferably is about 12 mins, being a function of factors such as the concentration and pH of the permanganate solution, and the temperature thereof. The same type and duration of agitating of the non-conductive substrate as described above for the conditioning step, is employed in this step.

The term "permanganate" refers to the salts of permanganic acid, e.g., potassium permanganate, $KMnO_4$. Any metal salt that is stable and soluble to the extent of at least about 2 g per L of water, is suitable for preparing the oxidizing and etching solution. However, it is preferred to employ an alkali metal salt, e.g., one of sodium, potassium, lithium, cesium, etc., or an alkaline earth metal salt, e.g., one of calcium, magnesium, etc. Because of ready availability, low cost, and good solubility, the most preferred salt forms are the sodium and potassium permanganates. The concentration of the permanganate solution which is employed will vary from about 10 to about 100 g per L of water, and preferably will be from about 20 to about 50 g per L of water. The pH of the permanganate solution is controlled by the addition of base, preferably one sharing a common or similar ion with the permanganate salt. Consequently, the preferred bases for this purpose are sodium and potassium hydroxides. The most preferred composition is a mixture of potassium permanganate and sodium hydroxide. It is theorized that the treatment with a permanganate solution forms a manganese oxide coating on the surface of the non-conductive substrate which is attached thereto by covalent bonds.

After treatment with the oxidizing and etching solution, preferably a high pH permanganate solution, the next step optionally comprises contacting the non-conductive substrate with a neutralizing and conditioning solution, which combines two distinct functions in a single composition. First, it is a reductant composition to solubilize the components of the oxidizing and etching solution for removal during the rinse step. Second, it functions to condition the epoxy/fiberglass or other polymer material surfaces of the non-conductive substrate in order to enhance the subsequent coverage and adhesion of the electroless coating. Third, it imparts a surface charge to the non-conductive substrate which is the opposite of the charge of the activating seed particles to be coated thereon in a subsequent step. The preferred neutralizer and conditioner solutions are mildly acidic aqueous solutions containing (1) hydrogen peroxide, (2) sodium bisulfate, and (3) a multifunctional ionic copolymer with at least two available cationic functional moieties. The preferred ionic moieties are quaternary phosphonium and quaternary ammonium groups. The ionic copolymer is used as a dilute acidic solution of about 0.5% by weight, with the acid contained in the solution preferably being sulfuric acid, $H_2SO_4$, and the pH value of the solution being between 0 and 3. It is preferred to use a low pH solution in order to obtain a relatively low viscosity in the solution when the copolymer is present. This is a simple expedient which greatly facilitates application of the solution, which is an effective conditioner for the through-hole wall surfaces of the non-conductive substrate. The multifunctional copolymer conditioner has very good adhesion to the substrate surface and provides that surface with a charge which is the opposite to that possessed by the activating seed particles which will be applied in a subsequent step. The difference in charges, i.e., polarity, provides an electrostatic attraction between the non-conductive substrate surface and the activating particles. The neutralizing and conditioning step is carried out at moderately elevated temperatures, preferably from about 50° F. to about 120° F., preferably from about 60° F. to about 110° F., and most preferably about 70° F. to 85° F., for a treatment time of from about 0.5 min to about 4 mins, preferably from about 1 min to about 3 mins, and most preferably about 1.5 mins. The length of time will depend on the type and concentration of the particular conditioning agent used, as well as the temperature at which the conditioning solution is maintained. The agitation is of the same type and duration as that in the other above-described steps. After the step is complete, it is followed by a rinsing step carried out in the same manner as in the other above-described steps.

An anti-tarnish agent can be used for storage of the plated substrates, and for enhancement off dry film adhesion, since there is no detrimental effect on electroless deposition and adhesion in the process of the present invention. However, the substantially reduced process times achieved by the method of the present invention through the utilization of horizontal, conveyorized wet processing modules with enhanced fluid dynamics and drying that can be linked directly to an automatic cut sheet dry film laminator with no hold time, makes the use of an anti-tarnish agent unnecessary.

At this point in the conventional sequence of process steps, a microetching step would normally be carried out in order to give a micro-toothed surface structure to the copper foil laminated to the non-conductive substrate, in order to facilitate strong bonding with the later-applied electroless copper, as well as to provide anchoring sites for the activator which permit it to mechanically bond to the laminated copper surface. However, in accordance with the present invention, it has been possible to eliminate this step in most cases, as a result of the change which has been made in the composition and application of the activator. A conventional activator comprises palladium as the catalyst held in a reduced state by a substantially larger number of stannous ions. This activator will be deposited on both the copper and non-conductive surfaces of the substrate, which are found in the through-holes. Because the process of the present invention uses electroless nickel deposition, and the nickel will bond directly to the copper surface, since it is higher in the electromotive series than copper, there is little need for the activator on the copper surfaces. The activator is required primarily on the non-conductive surfaces of the through-holes. This, in turn, has permitted the separation of the conventional catalyzing step into a two component sensitizing and activating system.

The step of activating the surface of the substrate in order to facilitate the subsequent deposit of metal thereon by electroless plating comprises contacting the substrate with the first component of the two component sensitizing and activating system, a sensitizing solution comprising a metal compound which is a reductant for the second component, which is an activating metal compound. This is sometimes referred to as the activation or seeding step, and it has become conventional practice in the manufacture of printed circuit boards to combine the sensitizing and catalyzing steps into a single treatment where, e.g., a solution of stannous chloride and palladium chloride with hydrochloric acid are used as a single bath in which the non-conductive substrate is immersed. The single bath is preferred to the separate treatments on economic grounds, as described in U.S. Pat. No. 5,358,602. As explained above, it is one of the key features of the present invention that this treatment has been divided essentially into two separate steps, the sensitizing and activating steps. In one embodiment of the present invention, there has been inserted between the sensitizing and activating steps, the step of photoresist imaging. The very significant advantages which flow from this unconventional rearrangement of processing steps is explained in detail further below.

As the sensitizing composition, it is preferred to use (1) stannous chloride, in an amount of from about 1 to about 200 g/L, preferably from about 10 to about 100 g/L, and more preferably from about 20 to about 80 g/L; (2) sodium chloride, in an amount of from about 50 to about 130 g/L or full saturation, preferably from about 90 to about 120 g/L, and more preferably from about 100 to about 110 g/L; (3) a Group VIII and IB transition metal ion, in an amount of from about 0.01 to about 1.0 g/L, preferably from abut 0.03 to about 0.18 g/L; (4) Hcl, in an amount of from 1 to about 10 mL/L, preferably from about 3 to about 9 mL/L, and more preferably from about 5 to about 8 mL/L; and (4) water to one L. The transition metal ion component of the sensitizing composition comprises one or more members selected from the group consisting of Group VIII and IB transition metals in the Periodic Table. This group specifically comprises manganese (Mn), iron (Fe), cobalt (Co), nickel (Ni), copper (Cu), palladium (Pd), platinum (Pt), silver (Ag), and gold (Au), and preferably palladium. A number of different salts of these metals may be used, e.g., $CoCl_2$, $CuCl$, $MnCl_2$, $NiCl_2$, $AgNO_3$ and $PdCl_2$. The sensitizer composition can be prepared in a straightforward manner, using techniques well known in the art. For example, a small amount of tin chloride, than 1 g, can be dissolved in HCl, 10 mL, and water, 50 mL, with heating and adding a small amount of a stabilizer such as resorcinol, about 100 ppm. Palladium chloride, $PdCl_2$, is then added slowly to the $SnCl_2$ mixture, and thereafter this mixture is added to the remainder of the ingredients of the sensitizing composition.

The length of time during which the non-conductive substrate is immersed in the sensitizing solution will depend on the type and concentration of the particular sensitizing agent used, as well as the temperature at which the sensitizing solution is maintained. It has been found that a treatment time of from about 1 min to about 5 mins, preferably from about 2 mins to about 4 mins, and most preferably about 3 mins, provides the expected results. After the sensitizing step is complete, it is followed by a rinsing step carried out in the same manner as the other above-described. steps. The stannous chloride is rinsed from the substrate and through-hole surfaces by the water, which removes any excess stannous chloride, and also hydrolyzes the stannous chloride on the surface to produce gelatinous tin hydrous oxides, which are absorbed on the surface of the substrate as a stannous complex.

At this point in the process, two different sequences of steps are possible as a result of two different embodiments of the present invention. In one embodiment, the preferred embodiment, the next step is the activation step, which is then followed by the steps involving application of the dry photoresist. In the other embodiment, the steps involving application of the dry photoresist actually takes place between the sensitizing and activation steps. The procedures for the activation step and application of the dry photoresist are largely the same for both embodiments, and will consequently only be described once.

In the preferred embodiment the next step is the activation step, in which the substrate is contacted with an activating composition comprising (1) palladium chloride and (2) hydrochloric acid. The divalent palladium ions interact with the stannous complex compounds on the substrate surfaces to form an adherent layer of metallic palladium particles. The basic reaction which takes place may be illustrated as follows:

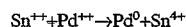

This reaction leads to the activating of the portions of the substrate surface to be metalized and eventually form the desired printed circuit pattern. The substrate is treated with an activating solution comprising an activating metal compound. This activating solution will be a solution containing a dissolved salt of one or more members selected from the group consisting of Group VIII and IB noble metals, preferably a salt of palladium (Pd), platinum (Pt), silver (Ag), or gold (Au). The activating compositions contain a noble metal which can directly provide the catalytic sites, or which can serve as precursors which lead to the catalytic sites. The metal present may be in elemental form, an alloy, or compound, or mixtures thereof. The preferred material is palladium. The activating metal ions will be retained only on the imaged pattern, i.e., the masked areas which were removed during development, and which correspond to the desired printed circuit pattern. These areas also contain the reductant stannous ions deposited during the earlier sensitizing step.

It is also within the scope of the present invention to employ other catalyzing compositions in place of the above-mentioned catalyzing. For example, one could employ a reduced catalytic metal firmly associated with an organic suspending agent, probably in colloidal form, prepared by adding a reducing agent, e.g., sodium borohydride, to an aqueous solution of the dissolved catalytic metal, in the presence of a suspending agent. Such compositions are described in U.S. Pat. No. 4,634,468. It is also within the scope of the present invention to utilize the so-called "triple-seeding" technique disclosed in U.S. Pat. No. 4,904,506, in which the surface of the non-conductive substrate is contacted first with a stannous chloride sensitizing solution, then with a palladium chloride activator, and then with a palladium chloride/stannous chloride/hydrochloric acid seeder bath.

The activating step is carried out at slightly elevated temperatures, preferably from about 70° F. to about 95° F., preferably from about 75° F. to about 90° F., and most preferably about 85° F. It has been found that a treatment time of from about 0.5 min to about 2 mins, preferably from about 0.75 min to about 1.5 mins, and most preferably about 1 min, will suffice to provide the desired results. Agitation is carried out in the same manner as with the early steps of the process described above, except that the rate of agitation is twice that of those steps. The activating step is followed by a rinsing step which is carried out in the same manner as described further above concerning the earlier steps in the process of the present invention.

The second embodiment of the present invention also represents a significant departure from the manufacturing processes of the past for printed circuit boards. As already discussed, after the sensitizing step, but before the activating step, the non-conductive substrate is imaged with the desired printed circuit on its sensitized surface, in a dry process. Thus, the catalyzing step, comprising a sensitizing and an activating step, conventionally combined into a single step, has not only been divided into separate steps, but these separate steps have been split by the conventional imaging process. This embodiment and the preferred embodiment of the present invention, which represent a novel departure from the conventional processes of manufacturing printed circuit boards, whether by PTH (plating through-hole) methods or direct plating methods, have led to a number of unexpected advantages, described further below.

After completion of the sensitizing step in the preferred embodiment, or after completion of the activating step in the second embodiment, the succeeding steps involve application of the photoresist. This is a dry process; consequently, whichever embodiment is involved, the substrate must be subjected to a very important drying step. Any conventional means can be used to carry out this drying, which will typically be carried out at from about 100° F. to about 140° F., preferably from about 110° F. to about 130° F., and more preferably about 120° F., and for a length of time ranging from about 0.5 min to about 2 mins, preferably about 0.75 min to 1.5 mins, and more preferably about 1 min.

An optional step at this point involves additional substrate surface preparation before the application of the dry photoresist film. Where the copper-clad substrate is obtained from a typical commercial source, mechanical deburring of the surface can be carried out as described above, or the surface treatment can be modified to include a microetching step before the sensitizer/activator steps. Deburring may employ a 320-grit brush which, although different from that used in conventional electroless copper methods, does not usually create a problem with dry film adhesion or stripping. Surface preparation immediately before dry photoresist film lamination, can employ brush or pumice scrubbing without any detrimental effect on the initiation of the nickel electroless plating deposit.

The dry film imaging process comprises the steps of 1) laminating onto the dried substrate surface a dry, negative photoresist layer; 2) imaging the photoresist by exposing the film to a source of activating energy to obtain the desired circuit pattern; and 3) developing the imaged photoresist. By imaging at this point in the overall process, it is possible to obtain selective activation and subsequent deposition of a conductive metal layer only to the through-holes and the outer layer printed circuit patterns. The step of laminating the negative photoresist layer onto the substrate surface is carried out by applying a dry, commercially available photoresist film, e.g., Dynachem HG from Morton International, at an application temperature of from about 200° F. to about 275° F., preferably from about 235° F. to about 245° F., and at an application line speed of from about 2 ft/min to about 6 ft/min, and usually from about 3 ft/min to about 5 ft/min. After a waiting period of approximately 15 minutes, and then aligning with the substrate surface an illumination mask, the film is exposed to a source of activating energy, i.e., irradiated, through the mask, in order to obtain the desired circuit pattern. Exposure intensity will typically be between about 25 mJ/cm$^2$ and about 85 mJ/cm$^2$. By exposure through the appropriate mask exactly aligned to the substrate, the negative of the desired circuit pattern is produced on the photoresist film after development is carried out in a spray chamber using a 0.85% solution of sodium carbonate, e.g., Dynachem KB-1A Developer, at a temperature of from about 78° F. to about 84° F., preferably about 81° F., at a breakpoint of 60%. The development step accomplishes the removal of the photosensitive composition from the non-illuminated areas, thus exposing the desired circuit pattern on the substrate surface to the deposition of metal in succeeding steps. Thus, in areas where the photoresist has been removed in the development step, the sensitized/activated substrate surfaces are exposed. The dry film photoresist process has no detrimental effect on those sensitized/activated surfaces.

The photoresist is a photosensitive composition which is applied, i.e., essentially laminated, to the surface of the non-conductive substrate, and which is capable of providing, once imaged and developed, a protective coating to the areas of the substrate surface which are the negative of the desired printed circuit pattern. A number of commercially available materials may be employed to make the photoresist. For example, suitable photopolymerizable compositions include the polymerizable polymeric esters disclosed in U.S. Pat.

Nos. 3,418,295; 3,469,982; and 4,089,686. Photoinitiators or sensitizers can also be added to the photopolymerizable composition, e.g., anthraquinone and substituted anthraquinones, benzotriazole and t-butylanthraquinone. Such photoinitiators will be used in amounts sufficient to sensitize the overall compositions to ultraviolet light, which will typically be in the range of from about 0.1% to about 5% by weight of the overall composition. a solution of the photopolymerizable composition may be applied to the surface of the non-conductive substrate in any suitable manner and then dried to form a layer; however, it is preferred to apply the photopolymerizable composition to the non-conductive substrate as a dry film, by coating the composition onto a carrier film, which must be capable of being stripped or released from the composition without damaging the integrity of the film. Films which meet these requirements can be made from polyethylene, polypropylene and other polyolefins; and polyesters, e.g., polyethyleneterephthalate or Mylar. The photosensitive composition is applied in a dry state by laminating it to the sensitized surface of the non-conductive substrate with the photosensitive composition coating adjacent to the sensitized surface. The step is carried out by heat laminating at a temperature of from about 200° F. to about 275° F., preferably from about 235° F. to about 245° F. It is essential to the overall success of the printed circuit board manufacturing process, that this step be carried out in such a way that there is adequate interdiffusion between the photosensitive layer and the substrate in later processing.

Once the layer of photopolymerizable composition has been applied to the non-conductive substrate, a suitable mask is placed contiguous to that composition layer. It is a positive mask, i.e., it has areas which are opaque to a certain radiation to which the positive mask as well as the entire non-conductive substrate surface are to be exposed. These opaque areas correspond to a desired electroless metal-deposited pattern which is the same as that of the pattern of the desired printed circuit. The other areas of the positive mask are capable of transmitting that same certain radiation to which the mask and substrate are to be exposed. A suitable radiation source, e.g., an actinic radiation source, is then placed in a contiguous relationship to the substrate having the positive mask thereover, whereupon the radiation is transmitted through those portions of the positive mask which will transmit that radiation. The underlying areas of the photopolymerizable composition are thereby exposed to that radiation and as a result, are polymerized. It is usually sufficient to expose such photopolymerizable compositions to, e.g., a carbon arc source for as short a time as 30 secs in order to achieve the desired results.

The last step in the photoresist or imaging step is the development of the imaged layer on the surface of the non-conductive substrate. This is accomplished by treating that coated substrate with a liquid which is a solvent for the unexposed polymerizable composition, which corresponds to the areas under the opaque portions of the positive mask. The liquid may be applied by any suitable method, such as by spraying or immersion, although spraying in a spray chamber is preferred. Of course, the solvent which is selected must be one in which the polymerized photoresist is not soluble. While the chlorinated hydrocarbons, e.g., methylene chloride, carbon tetrachloride, 1,1-dichloroethane and 1,1,2-trichloroethylene, are conventional solvents for this purpose, it is preferred to use sodium and potassium carbonate and similar compositions, since they have a less serious adverse impact on the environment. After this development step has been completed, the non-conductive substrate will have a surface layer of polymer, upon which there is a pattern formed by the removal of unpolymerized material, which corresponds to the desired printed circuit pattern, and which exposes the underlying surface of the non-conductive substrate, including through-holes, which have already received the above-described sensitizing treatment.

Another advantageous feature of the present invention, is that it is not necessary to remove the developed, i.e., polymerized photopolymerizable composition, layer from the non-conductive substrate at this stage. Indeed, it is not removed until after the last step described herein, that of electrolytic copper plating. The polymer layer will subsequently be removed during the steps in which the tin-lead-plate is applied to the circuit board having the copper electroplate applied, and it can be removed using procedures will known in the art. Underneath the polymer layer lies the copper cladding of the substrate, which was present when the process began. This copper must also be removed, for when the desired printed circuit pattern which has already been imaged, is later metalized, there must be only nonconductive material surrounding that metalized, conductive pattern. However, the steps involved in removing the developed, i.e., polymerized photoresist will also remove the copper cladding beneath it, from the developed and unwanted areas on the surface of the sensitized and imaged substrate.

In a preferred embodiment of the present invention, the substrate with the developed printed circuit image thereon is cleaned in preparation for the electroless nickel plating by treatment with an etching and cleaning composition comprising (1) sulfuric acid and (2) surfactants. The etching and cleaning composition is used to remove significant amounts of catalytically deposited activator or film from any copper surfaces present on copper clad circuit boards. Such catalytically deposited films where present on the copper foil in excess, create zones of potentially poor adhesion, where the subsequently electroplated copper may fail to adhere to the copper cladding. These catalyst deposits may also disrupt the flow of electricity on subsequently formed circuits, making it difficult to measure circuit impedance with a high level of certainty.

The next step in the process of the present invention is also one that represents a significant departure from conventional printed circuit board PTH manufacturing processes. This step involves contacting the catalyzed substrate with an electroless nickel plating bath to produce metalization of the imaged areas of said substrate. While both nickel and copper are known to be usable in electroless plating methods, the use of copper in these processes is almost universal, to the near total exclusion of nickel, where electroless plating processes are currently used for making printed circuit boards. It was unexpected, therefore, that the use of electroless nickel plating in the method of the present invention would provide such improved results and excellent final product characteristics. The plating solutions which are employed in this step comprise (1) a source of the nickel plating metal, usually a metal salt such as nickel sulfate, in an amount of from about 5 to about 50 g/L, preferably from about 10 to about 40 g/L, and more preferably from about 25 to about 35 g/L; (2) a complexing agent for the metal salt sufficient to prevent its precipitation from solution, for example sodium acetate NaAc or succinic acid, in an amount of from about 2 to about 50 g/L, preferably from about 10 to about 15 g/L; (3) a reducing agent such as sodium borohydride or dimethylamineborane, in an amount of from about 0.25 to about 5 g/L, preferably from about 2 to about 3 g/L; (4) a pH adjustor such as an acid; and (5) a stabilizer to prevent spontaneous decomposition of the plating solution, for example lead acetate, PbAc, in an amount of from about 0.0015 to about 0.015 g/L. Because the photopolymerized polymer coating on the substrate is still in place during the electroless nickel plating, it is important that the temperature of the plating step be less than that which will cause any damage or disruption to the polymer layer. This temperature will usually be about 130° F. In order to obtain electroless nickel plating compositions that will give satisfactory results at temperatures from room temperature to less than about 130° F., it has been found that by maintaining the metal complexing ratio at a certain level, this objective is readily achieved. The amounts necessary to achieve the desired ratio will depend upon the nickel salt, the complexing agent, the other ingredients of the composition, and the desired operating temperature. Routine experimentation will quickly identify the optimum ratio for each particular set of conditions. As a result of practical considerations, the electroless nickel coating thickness on the board substrate does not have to be as thick as that which must be applied by conventional electroless copper processes. This fact also contributes to simplifying the task of maintaining the electroless nickel plating bath at an acceptably low temperature.

The electroless plating step is carried out at slightly elevated temperatures, preferably from about 65° F. to about 105° F., preferably from about 75° F. to about 95° F., and most preferably about 85° F. It has been found that a treatment time of from about 1 min to about 5 mins, preferably from about 2 mins to about 4 mins, and most preferably about 3 mins, will suffice to provide the desired results. Agitation is carried out in the same manner as with the early steps of the process described above, except that extra measures are taken to assure that the plating bath solution passes through the through-holes of the substrates. The electroless nickel plating step is followed by a rinsing step which is carried out in the same manner as described further above concerning the earlier steps in the process of the present invention.

Suitable complexing agents for use in such compositions include Rochelle salts, ethylene diamine tetraacetic acid and its sodium salts, nitrilo tetraacetic acid and its alkali metal salts, gluconic acid and its gluconate esters, triethanol amine, glucono γ-lactone, modified ethylene diamine acetates. The amount of complexing agent which will be employed is from about 30 g to about 50 g per L of plating bath solution. Suitable reducing agents for use in such compositions include borohydrides such as the alkali metal borohydrides, and substituted borohydrides such as sodium trimethoxy borohydride; and boranes such as amine borane, isopropyl amine borane, and morpholine borane; and various hypophosphite reducing agents. The amount of reducing agent which will be employed is from about 1 mL to about 6 mL per L of plating bath solution.

Optionally, there may be employed as the next step in the process of the present invention, contacting the imaged and metalized substrate with an acid solution to prepare it for the subsequent plating step. The primary purpose of this step is to maintain the pH balance, and therefore stability, between the electroless nickel plating bath, which is essentially basic, and the electrolytic copper pattern plating bath, which is essentially acidic. Preferably an acidic agent, selected from sulfuric acid, chromic acid, hydrochloric acid, hydrofluoric acid, nitric acid, and the like, is used at sufficiently high concentration to achieve the pH adjusting and stabilizing objective. It is preferred to use an aqueous sulfuric acid solution comprising from about 5% to about 20% by volume of concentrated sulfuric acid, and more preferably a 10% solution or acid dip is used. The pH adjusting and stabilizing step is carried out at ambient or slightly elevated temperatures, preferably from about 70° F. to about 100° F., preferably from about 75° F. to about 90° F., and most preferably about 80° F. The length of time during which the non-conductive substrate is immersed in the acidic solution will depend on the type and concentration of the particular acid agent used, as well as the temperature at which the acidic solution is maintained. It has been found that a treatment time of from about 0.5 min to about 2 mins, preferably from about 0.75 min to about 1.5 mins, and most preferably about 1 min, will suffice to provide the intended results. Agitation is carried out with the same means as in the other process steps described above, except that care is taken, and means are provided, for ensuring that the acidic solution is passing through the through-holes of the non-conductive substrate.

The last step of the process of the present invention comprises directly plating a metal onto the imaged and metalized surface of the non-conductive substrate to provide a pattern plated non-conductive substrate printed circuit board. This is a conventional step and is usually referred to as pattern plating, since it puts down on the non-conductive substrate the finished metal pattern which comprises the printed circuit. The substrate is directly electroplated with a layer of metal, which is preferably copper, but may also be nickel or other metals which will provide satisfactory conductivity in the finished circuit board. Copper is the metal of choice for economic and other reasons, although nickel may be chosen for specialty applications such as making microelectronic circuits that will are free of electrostatic interference. The electroplating bath is preferably maintained at ambient or a slightly elevated temperature, preferably from about 75° F. to about 105° F., preferably from about 80° F. to about 95° F., and most preferably about 85° F. The electroplating process should be continued for a sufficient period of time to form a deposit of the desired thickness. The time required for such electroplating to be completed is a function of the total area ($ft^2$) of metallizing, i.e., through-holes and traces, to be covered. Most electroplating is completed in from about 40 to about 90 min, preferably from about 45 to 50 min. Typically, the desired thickness of the deposits on the printed circuit boards will range from about 0.8 mils to about 2.0 mils. It has been found that with the method of the present invention, peeling and cracking of the deposited metal circuit does not occur, even under use conditions which involve stresses such as physical jarring and high temperatures. The metal deposits are uniform and crisply defined on the substrate, have excellent adhesion to the substrate, and show an absence of irregularities such as nodules, voids, cavities and jagged edges.

The electroplating procedures in this step are conventional. The non-conductive substrates which are to be plated become the cathodes in a typical electroplating cell, which in this case is the electroplating bath. The non-conductive substrates become, in effect, a continuously moving cathode. Current density will vary within the range of from about 1 to about 10 amps/$dm^2$, although a current density of from about 2 to about 5 amps/$dm^2$ is preferred. The plating solution bath should be maintained at a temperature of from about 60° F. to about 100° F., preferably from about 70° F. to about 90° F., and more preferably about 80° F. The length of time for which the non-conductive substrate remains in the electroplating bath will depend on a number of factors, but the endpoint will always be the point at which the desired thickness of the metal deposit has been reached. For printed circuit board manufacturing generally, the desired thickness of the metal deposits will be between about 0.8 and 2.0 mils, preferably between about 1 and 1.5 mils. Within this preferred range of thicknesses, and the preferred range of current densities, it will take from about 45 to about 90 minutes to obtain the desired deposit thickness.

In order to facilitate the improvements achieved by using the horizontal, conveyorized wet processing modules and their enhanced fluid dynamics, it is within the scope of the present invention to also employ in conjunction therewith analytical determinations to assist in deciding when, and how much replenishment additions need to be made to the various treatment baths. These analytical determinations can be made by automated devices which take readings on a predetermined and ongoing basis. The determinations which are made are converted to electronic data which is then fed directly to a computer. When this system is used in conjunction with means for automatically adding replenishing compositions to the process baths, it is possible to completely automate the overall manufacturing process of the present invention. In particular, the electroless nickel bath is analyzed and controlled by cheliometric titration for concentration, idiometric titration for reducing agent, and by pH. Due to the comparatively low surface area being metallized, with typically 70% of the panel surface area being covered by dry film photoresist, the electroless nickel bath can be operated in a steady-state made with extremely long bath life. Replenishment is made based on the depletion of metal, with replenishment being automatically controlled or made by batch mode, in order to maintain the recommended operating ranges.

Printed circuit board manufacturers are becoming increasingly concerned about the reduction in permitted generation of hazardous sludge from metal-beating waste and the ever tighter restrictions on water discharge. As part of the present invention, there is incorporated into the processes of the present invention, a specific electrolytic recovery system for the control of metallic pollution created by the rinse waters and spent metal-bearing baths or concentrates used in those processes. Using that electrolytic recovery system, it is possible to achieve a zero residual metal level prior to discharge. This electrolytic recovery system offers: (1) control at the source of pollution and recovery of all metals that would otherwise require waste treatment; (2) de-metallization of spent chemical baths to levels consistent with direct discharge, requiring only pH adjustment; (3) plating solutions may be treated with complexing agents which are eliminated by anodic oxidation at the same time as cathodic metal recovery is ongoing; and (4) deployment on a static drag-out rinse to produce out fall levels of 0.5 ppm or less. By adding on the electrolytic recovery system, it is possible to achieve levels of 0.05 ppm or less.

In addition to the two process embodiments of the present invention described above, and the many modifications of those processes which would be apparent to the artisan in accordance with various above-described treatment agents which might be substituted for, or used in addition to, those specifically recited in the process steps, there should be noted further process embodiments contemplated to be within the scope of the present invention. One such embodiment introduces a microetching step between the neutralizing/conditioning step and the sensitizing step. This additional step is preferably carried out at a temperature of from about 70° F. to about 150° F., more preferably from about 90° F. to about 130° F., and most preferably at about 110° F.; and for a time of from about 0.5 min to about 3 mins, preferably from about 0.75 min to about 2 min, and more preferably for about 1 min. Another such embodiment of the present invention involves replacing the permanganate and neutralizing/conditioning steps with plasma desmear and glass etching steps, while retaining the microetching step before the sensitizing step, described in the paragraph immediately above.

The processes of the present invention offer a number of significant advantages over the conventional electroless copper deposition process for metallizing non-conductive substrates which are double-sided and multilayered and have multiple through-holes, in order to prepare them for subsequent electroplating. Among the disadvantages of conventional electroless copper plating methods are their use of formaldehyde, a known carcinogen, as the reducing agent; their inherent instability, which requires the use of stabilizers such as cyanide compounds, to prevent copper plate-out; their use of environmentally undesirable complexing agents and chelates, e.g., ethylenediamine-tetraacetic acid (EDTA) to keep copper in solution in a strongly alkaline medium; and their use of a relatively large number of chemical treatment and rinsing steps, resulting in undesirably high processing times and water consumption. These disadvantages have spurred the search for methods which provide a viable alternative to conventional electroless copper deposition.

Efforts have been made, for example, to replace formaldehyde with other reducing agents, e.g., hypophosphite or boron compounds. See Kronenberg, 10, *Ulmer Gresprach, Eugen Lueze Verlag, Sauleau*, pp. 60–64 (1988). With regard to Palladium Based Systems, conductive sulfides have been proposed for direct electroplating. See U.S. Pat. No. 4,810,333 to Gulla et al.; and EP-a-0 298 298 to Bladon. Proposals for modifications of the electroplating bath in direct electroplating of conventional palladium activated holes have been made in U.S. Pat. No. 4,891,069 to Holtzmann; and DE 3 304 002 to Passlick. The use of a palladium based activator which employs vanillin for direct electroplating is described in U.S. Pat. No. 4,933,010 to Okabayashi. With regard to Carbon/Graphite Based Systems, the use of carbon black particles and graphite for preparing hole walls for direct electroplating is described in U.S. Pat. No. 4,684,560 to Minten et al.; and U.S. Pat. No. 4,622,107 to Piano et al. With regard to Conductive Polymer Based Systems, polymer stabilized palladium colloids for activation and direct electroplating of non-conductive substrates have been developed by Kronenberg et al., and described in DE 3 741 490. Other systems involve the selective plating of holes and circuits using electroless copper and electroplating in two steps without interruption, such as that described in U.S. Pat. NO. 4,790,912 to Holtzmann et al. Other processes involve the use of special photoresists which do not become activated, or involve subsequent deactivation of conventional resists. See U.S. Pat. No. 4,683,036 to Morrisey et al.; U.S. Pat. No. 4,749,052 to Scott; and U.S. Pat. No. 4,759,952 to Brasch et al. a selective metallization process referred to as "Slotoposit", which uses electroless nickel after photoresist application, is described in Roubal et al., *Galvanotechnik*, Vol. 80, No. 1, pp. 226–230 (1989).

In the processes of the present invention, the use of electroless copper has been replaced with a high purity, conductive electroless nickel, without reduction in reliability. The electroless nickel process as used in the present invention, selectively metallizes through-holes with fewer process steps and less time than conventional electroless copper methods which plate the entire panel surface area. Effluent treatment has also been simplified. The conditioning, sensitizing and activation, and electroless nickel steps are only mildly acidic. The processes of the present invention are distinguished by the following key characteristics: (1) through-hole wall conditioning and activation is integrated with an alkaline permanganate desmear process; (2) conventional accelerators are not necessary and are preferably not used in these processes; (3) it is not necessary to use a microetching step, thus saving time and chemical additive; (4) electroless copper plating is not used, which makes it possible to eliminate the use of formaldehyde, cyanides and strong chelating or complexing agents; (5) the through-hole wall conditioning, sensitizing, and activation process steps are mildly acidic and precede dry-film lamination, imaging and development; (6) through-hole plating and pattern plating are carried out one after the other without interruption, "wet on wet"; (7) a very high purity conductive nickel layer is deposited from a mildly acidic, low temperature electroless bath; (8) selective plating of through-holes and traces is achieved by a new process flow sequence which is compatible with current dry film photoresist technologies; and (9) vertical and horizontal processing capabilities are possible because established principles of electroless deposition are being utilized.

Other advantages provided by the processes of the present invention include reduction of the plating surface area from the entire panel, i.e., non-conductive substrate surface, to only the circuits and through-holes; a reduction in the through-hole processing time of about 40% compared to conventional processes; continued utilization of well-understood and optimized electroless metallization process principles; minimal modification of existing plated through-hole processing equipment, and adaptation to vertical processing without capital equipment cost; optimization of process efficiency by using conveyorized horizontal processing capabilities integrated with the alkaline permanganate desmear process; production of both high manufacturing yields and high-end through-hole reliability as the result of vertical and horizontal processing capabilities; selective metallization in the presence of a dry film photoresist; reduction in manufacturing time and optimization of just-in-time manufacturing capabilities by means of continuous production flow from the drill step to the imaging step; reduction of rinse water consumption by about 80% of that used in conventional processes, leading to a commensurate reduction in waste water treatment costs; reduction in the usage of chemical agents through lower process tank volumes and higher processing efficiency; reduction in the treatable square footage of surface area from the panel size to the through-hole surface area, as the result of selective through-hole processing; optimization of the treatment bath solution flow through the holes of individually processed panels, by means of equipment fluid dynamics ensuring uniform treatment and coverage of all hole sizes; minimization of the potential for pink ring in multilayer fabrications, as a result of shorter dwell times in the desmear step and other plated through-hole treatment chemistries; and maximization of operator safety through use of enclosed equipment systems which reduce operator exposure to chemical contact and fumes.

Some of the differences between the preferred embodiment process of the present invention and other currently available processes, will be better understood from the following comparative process flow chart analysis:

| Conventional | Palladium | Palladium Sulfide | Carbon | Present Invention |
|---|---|---|---|---|
| Drill | Drill | Drill | Drill | Drill |
| Deburr | Deburr | Deburr | Deburr | Deburr |
| Desmear | Desmear | Desmear | Desmear | Desmear |
| Clean/Condition | Condition | Sensitize | Condition | Sensitize |
| rinse | rinse | rinse | rinse | rinse |
| Microetch | Microetch | Activate | Carbon Coat | Activate |
| rinse | rinse | rinse | rinse | rinse |
| Preactivate | Preactivate | Converter | Microetch | (deburr) |
| Activator/Catalyst | Activator | rinse | rinse | Dry |
| rinse | rinse | Enhancer | Anti-Tarnish | DRY FILM |
| Accelerator | Accelerator | rinse | DRY FILM | Acid Cleaner |
| rinse | rinse | Stabilizer | Acid Clean | rinse |
| Electroless Copper Plate | Dry | rinse | rinse | Electroless Nickel Plate |
| rinse | DRY FILM | Microetch | (Microetch) | rinse |
| Acid Dip | Acid Clean | rinse | rinse | Pattern Plate |
| rinse | (Microetch) | Dry | Pattern Plate | |
| Anti-Tarnish | rinse | DRY FILM | | |
| rinse | Pattern Plate | Acid Clean | | |
| Dry | | rinse | | |
| DRY FILM | | (Microetch) | | |
| Acid Clean | | rinse | | |
| rinse | | Pattern Plate | | |
| (Microetch) | | | | |
| rinse | | | | |
| Pattern Plate | | | | |

DESCRIPTION OF PREFERRED EMBODIMENTS

Set out immediately below are examples which demonstrate various preferred embodiments of the present invention. These examples are illustrative only, and should in no way be considered or construed to be a limitation of the scope of the present invention, which is set out in the claims appended hereto.

EXAMPLE 1

Catalyzing Step Separated by Imaging Step: Sensitizing—Imaging—Activating

A two-sided copper clad epoxy-glass laminate board containing through-holes was metalized using the following procedure:

Step 1—Clean and condition the circuit board base material:
 a. clean the base material by immersing it in a bath containing 10% sulfuric acid and acetone at 140° F. for 3 minutes with agitation; and water rinse;
 b. condition the cleaned and swelled base material by immersing it in a bath of potassium permanganate ($KmnO_4$) at a pH of 13.5 at 175° F. for 6 minutes with agitation; and water rinse;
 c. remove any manganese deposits and copper oxides, and condition the through-hole wall surfaces, by immersing the permanganate treated base material in a bath containing 10% sulfuric acid and hydrogen peroxide at 100° F. for 3 minutes with agitation; and water rinse;

Step 2—Perform the first phase of catalyzing the base material: deposit a sensitizing layer on the base material by immersing the base material in a bath containing stannous chloride, sodium chloride and palladium chloride in concentrated (37%) HCl at 95° F. for 2 minutes; water rinse and thoroughly dry.

Step 3—Image the desired printed circuit pattern on the base material:
  a. apply a photopolymerizable coating to the surface of the sensitized base material by laminating a dry photosensitive photoresist film to the dry surface of the base material at 122° F.;
  b. image the photoresist by aligning with its surface an illumination mask, the masked area of which corresponds to the positive of the desired circuit pattern, and then irradiate the photoresist through the mask;
  c. develop the photoresist by treating it with potassium carbonate to remove the photosensitive composition from the non-illuminated areas, and to expose the desired circuit pattern on the base material surface.

Step 4—Complete the second phase of catalyzing the base material: activate the sensitized printed circuit pattern on the base material by immersing it in a bath containing 2.5 g of palladium chloride ($PdCl_2$) and 300 mL of 37% HCl per L of bath solution, at 80° F. for 1 min, with vigorous agitation; and water rinse;

Step 5—Form a first metalized coating and clean the base material:
  a. electroless nickel plate the catalyzed printed circuit pattern on the base material by immersing it in a plating bath containing a source of the nickel plating metal, a complexing agent therefor, a reducing agent, a pH adjustor, a surfactant, and a stabilizer, at 85° F. for 3 mins with vigorous agitation; and water rinse;
  b. clean the electroless nickel plated printed circuit pattern base material by immersing it in a bath of 10% sulfuric acid, at 80° F. for 1 min, with vigorous agitation.

Step 6—Form a second metalized coating on the base material: pattern electroplate copper onto the nickel metal deposited on the printed circuit pattern on the base material by immersing the base material in an electroplating bath in which the base material is a continuously moving cathode, the current density is 5 amps/$dm^2$, at 80° F., for 1 hr, to obtain a deposit thickness of 1.5 mils.

EXAMPLE 2

Catalyzing Step Separated and Followed by Imaging Step: Sensitizing—Activating—Imaging Drilled double-sided and multilayer printed circuit boards and their through-holes were prepared for copper electroplating by first mechanically scrubbing the surfaces of the boards and then immersing them in the following sequence of aqueous baths at the temperatures and for the times indicated in the table of values set out below.

TABLE 1

| PROCEDURE/STEP | TEMP. (°F.) | TIME (Min) |
|---|---|---|
| 1. Epoxy swell | 140 | 5 |
| 2. Rinse in tap water | | 1 |
| 3. Rinse in tap water | | 2 |
| 4. Permanganate desmear | 175 | 12 |
| 5. Rinse in tap water | | 2 |
| 6. Rinse in tap water | | 3 |
| 7. Neutralizer-conditioner | 85 | 3 |
| 8. Rinse in tap water | | 1 |
| 9. Rinse in tap water | | 1 |
| 10. Sensitizer | 85 | 3 |
| 11. Rinse in tap water | | 2 |

TABLE 1-continued

| PROCEDURE/STEP | TEMP. (°F.) | TIME (Min) |
|---|---|---|
| 12. Rinse in tap water | | 1 |
| 13. Activator | 85 | 1 |
| 14. Rinse in tap water | | 1 |
| 15. Rinse in tap water | | 1 |
| 16. Dry | | as required |
| 17. Dry film imaging process: laminate, expose, develop | | as required |
| 18. Acid cleaner | 85 | 2 |
| 19. Rinse in tap water | | 1 |
| 20. Electroless nickel | 85 | 3 |
| 21. Rinse in tap water | | 2 |
| 22. 10% Sulfuric acid dip | | 1 |
| 23. Acid copper plating | | as required |
| 24. Rinse in tap water | | 2 |

EXAMPLE 3

Preferred Horizontal Process Flow

Following is another illustration of the preferred process embodiment of the present invention, in which there is also provided additional detail concerning the horizontal processing steps and the particular compositions used in each step. The details are set out in Table 2 below, which represents the horizontal process flow, while the data continued below and adjacent to Table 2 represents the remainder of the process.

TABLE 2

| STATION | SEQUENCE | TEMP. | TIME | AGITATION |
|---|---|---|---|---|
| 1 | Feed Conveyer | N/a | N/a | N/a |
| 2 | Hole Preparation: butyl carbitol; glycol ethers | 140° F. | 3 mins. | 3 Push/Pull |
| 2 | Power Wash | Ambient | 1 min. | Spray |
| 4 | Permanganate Etch: potassium permanganate; sodium hydroxide | 175° F. | 6 mins. | 6 Push/Pull |
| 5 | Power Wash | Ambient | 1 min. | Spray |
| 6 | Neutralizer-Conditioner: hydrogen peroxide; sodium bisulfate; multifunctional ionic copolymer | 85° F. | 3 mins. | 3 Push/Pull |
| 7 | Power Wash | Ambient | 1 min. | Spray |
| 8 | Sensitizer: stannous chloride; sodium chloride; palladium chloride; water | 85° F. | 2 mins. | Forced Flood |
| 9 | Power Wash | Ambient | 1 min. | Spray |
| 10 | Activator: palladium chloride; hydrochloric acid | 85° F. | 1 min. | 2 Push/Pull |
| 11 | Power Wash (HPS) | Ambient | 1 min. | Spray |
| 12 | Dry | 120° F. | 1 min. | N/a |
| 13 | Exit Conveyer | N/a | N/a | N/a |

Deburr/substrate preparation (240 grit brush)
↓
Dry film image (laminate, expose, develop)
↓
Pattern Plate Rack

| | | | |
|---|---|---|---|
| Acid Cleaner: Sulfuric acid; surfactants | 85° F. | 3 mins. | Through-hole |
| Water Rinse | Ambient | 1 min. | Through-hole |

↓

| | | | |
|---|---|---|---|
| Electroless Nickel Plating: Nickel sulfate; hypophosphite; acid; | 85° F. | 3 mins. | Through-hole |

TABLE 2-continued

| STATION | SEQUENCE | TEMP. | TIME | AGITATION |
|---|---|---|---|---|
| | complexing agent; stabilizer | | | |
| | Water Rinse | Ambient | 1 min. | Through-hole |
| | 10% Sulfuric Acid | Ambient | 1 min. | Through-hole |
| | Acid Copper Electroplate: | | | |

EXAMPLE 4

Embodiment Comprising a Microetching Step Before Sensitizing

The two component sensitizing and activating system of the present invention, which permits direct palladium to copper bonding by displacement, substantially eliminates the need for microetching of the copper foil. The purpose of microetching in conventional processes is to give a micro-toothed surface structure to all copper surfaces that will ultimately be plated over with electroless copper, in order to assure an adequate bond between the electroless copper and the laminated copper foil. Nevertheless, it is possible to include such a microetching step as an optional, alternative embodiment of the present invention. In that event, such a microetching step might be introduced between the neutralizer/conditioner step and the sensitizer step.

TABLE 3

| SEQUENCE | TIME | TEMP. |
|---|---|---|
| DRILL | — | — |
| DEBURR | — | — |
| HOLE PREPARATION | 5 MINS. | 140° F. |
| Rinse × 2 | 2 Mins. Each | — |
| PERMANGANATE ETCH | 15 MINS. | 175° F. |
| Drag-out | 1 Min. | — |
| Rinse × 2 | 2 Mins. Each | — |
| NEUTRALIZER/CONDITIONER | 5 MINS. | 85° F. |
| Rinse × 2 | 2 Mins. Each | — |
| MICROETCH | 1 MIN. | 110° F. |
| Rinse × 2 | 1 Min. Each | — |
| SENSITIZER | 3 MINS. | 85° F. |
| Rinse × 2 | 2 Mins. Each | — |
| ACTIVATOR | 1 MIN. | 85° F. |
| Rinse × 1 | 1 Min. | — |
| DRY (OPTIONAL SURFACE PREPARATION) | — | — |
| DRY FILM IMAGE PROCESS (Laminate, expose, develop) ELECTROLYTIC PATTERN PLATE PROCESS: | — | — |
| Load Racks | — | — |
| ACID CLEANER | 1 MIN. | 85° F. |
| Rinse | 1 Min. | — |
| ELECTROLESS NICKEL PLATING | 3 MINS. | 85° F. |
| Rinse | 1 Min. | — |
| 10% Sulfuric acid | 1 Min. | — |
| ACID COPPER PATTERN PLATE | — | — |

EXAMPLE 5

Embodiment Comprising a Plasma Desmear Step

Although not preferred, an alternative embodiment of the present invention which can optionally be used, a plasma desmear step can be used in place of the permanganate etch step of the present process. A further optional embodiment of the present invention involves a glass etching step after deburring, which can also be combined with the optional microetching step described in Example 4, preceded by a modified conditioner step. These optional steps illustrate that there are a number of ways in which boards can be prepared prior to the sensitizing step by using conventional techniques in various combinations. There purpose is to provide additional surface preparation for panels, especially glass fiber filled epoxy panels, and especially those having through-holes with smaller than standard diameters, and which will have compacted circuits when they are imaged, with less than standard distances between traces. All of these variations are within the scope of the present invention.

TABLE 4

| SEQUENCE | TIME | TEMP. |
|---|---|---|
| PLASMA DESMEAR: | | |
| DRILL | — | — |
| PLASMA DESMEAR | — | — |
| DEBURR | — | — |
| GLASS ETCH | 5 MINS. | 80° F. |
| Rinse | 2 Mins. | — |
| PLATED THROUGH-HOLE PROCESS: | | |
| CONDITIONER | 5 MINS. | 150° F. |
| Rinse × 2 | 2 Mins. Each | — |
| MICROETCH | 1 MIN. | 110° F. |
| Rinse × 2 | 1 Min. Each | — |
| SENSITIZER | 3 MINS. | 85° F. |
| Rinse × 2 | 2 Mins. Each | — |
| ACTIVATOR | 1 MIN. | 85° F. |
| Rinse × 1 | 1 Min. | — |
| DRY (OPTIONAL SURFACE PREPARATION) | — | — |
| FULLY AQUEOUS DRY FILM IMAGE PROCESS (Laminate, expose, develop) ELECTROLYTIC PATTERN PLATE PROCESS: | — | — |
| Load Racks | — | — |
| ACID CLEANER | 1 MIN. | 85° F. |
| Rinse | 1 Min. | — |
| ELECTROLESS NICKEL PLATING | 3 MINS. | 85° F. |
| Rinse | 1 Min. | — |
| 10% Sulfuric acid | 1 Min. | — |
| ACID COPPER PATTERN PLATE | — | — |

EXAMPLE 6

Printed Circuit Boards Prepared by a Conventional Process

Circuit boards were prepared for copper electroplating using a conventional process by immersing them in the sequence of aqueous baths set out in the table of values below.

TABLE 5

| PROCEDURE/STEP | TEMP. (°F.) | TIME (Min) |
|---|---|---|
| 1. Solvent swell | | 5 |
| 2. Rinse in tap water | | 1 |
| 3. Rinse in tap water | | 2 |
| 4. Permanganate desmear | | 15 |
| 5. Rinse in tap water | | 2 |
| 6. Rinse in tap water | | 3 |
| 7. Neutralizer | | 5 |
| 8. Rinse in tap water | | 1 |
| 9. Rinse in tap water | | 2 |
| 10. Cleaner-conditioner | | 5 |
| 11. Rinse in tap water | | 2 |
| 12. Rinse in tap water | | 3 |
| 13. Microetch | | 1 |

TABLE 5-continued

| PROCEDURE/STEP | TEMP. (°F.) | TIME (Min) |
|---|---|---|
| 14. Rinse in tap water | | 1 |
| 15. Rinse in tap water | | 1 |
| 16. Pre-dip | | 1 |
| 17. Sn/Pd activator | | 5 |
| 18. Rinse in tap water | | 2 |
| 19. Rinse in tap water | | 2 |
| 20. Accelerator | | 5 |
| 21. Rinse in tap water | | 2 |
| 22. Rinse in tap water | | 1 |
| 23. Electroless copper | | 30 |
| 24. Rinse in tap water | | 2 |
| 25. Rinse in tap water | | 1 |
| 26. Acid dip | | 1 |
| 27. Rinse in tap water | | 1 |
| 28. Dry | | as required |
| 29. Dry film imaging process: laminate, expose, develop | | as required |
| 30. Acid cleaner | | 5 |
| 31. Rinse in tap water | | 2 |
| 32. Microetch | | 1 |
| 33. Rinse in tap water | | 1 |
| 34. 10% Sulfuric acid dip | | 1 |
| 35. Acid copper plating | | as required |
| 36. Rinse in tap water | | 2 |

EXAMPLE 8

Analysis of Plating Results

It is possible to make an accurate determination the degree of through-hole metal coverage in a plated through-hole process by means of a backlight test. In accordance with this test procedure, a test sample is prepared by cutting a thin section through the center of a row of electroless plated holes; and the sample slice is then lighted from behind using the prescribed light source. The through-hole section is then observed under 50–100× magnification. The complete absence of transmitted light is taken as the standard for 100% complete electroless metal coverage. Such a test procedure is described in IPC Test Methods Manual TM-650 No. 2.2.1.

While it is essential to test for perfect, void-free metal coverage, this is not the only criterion for measuring the quality of a plated through-hole printed circuit board and the process that produced it. The plated through-hole must also exhibit excellent hole-wall adhesion, i.e., the deposited electroless layer must remain uniform and adhered to the through-hole throughout a variety of printed circuit board manufacturing processes. One test procedure for measuring this characteristic of plated through-holes is that carried out in accordance with thermal stressing tests after exposure to high temperature solder float, as set forth in IPC Test Method Manual, TM-650 No. 2.6.8.

In order to demonstrate that the processes of the present invention provide plating adhesions which are equal to or better than those obtained with conventional electroless copper processes, a number of different substrates were subjected to the process of the present invention and to a conventional electroless copper process. The plated substrates were then subjected to testing to determine the peel strength, in lbs./inch, of the platings. The results are set out in the table of values below.

TABLE 6

| SUBSTRATE | ELECTROLESS COPPER | PRESENT INVENTION |
|---|---|---|
| FR-4 (tetrafunctional) | 2.60 | 2.60 |
| FR-4 (multifunctional) | 2.45 | 2.55 |
| Polyimide | 2.05 | 2.05 |
| Teflon ® | 2.00 | 2.05 |
| BT | 1.20 | 1.20 |
| Copper-Invar-Copper | 2.60 | 2.60 |
| GLASS STYLE COVERAGE:* | | |
| 7628/7629 | 8–9 | 9–10 |
| 2113/2313 | 9–10 | 9–10 |
| 1080 | 9–10 | 9–10 |

*Coverage is based on the backlight testing scale of 0–10.

EXAMPLE 9

Pattern Electroplating with Copper

The last step of the process of the present invention, in which the final metal layer is electrolytically plated onto the base material to form the printed circuit board final product, is carried out by taking a base material carried through the electroless plating and cleaning of Step 5, a. and b. in Example 1 above, and treating it as follows:

1) the sample is given a copper strike by immersing it in an air-agitated aqueous bath containing 45 g/L of copper sulfate, 5.5% by volume of sulfuric acid, and 50 ppm of cupric chloride.

2) following the treatment immediately above, the sample is immersed in an acid copper bath for about 60 to 90 minutes, to deposit copper plate on the printed circuit pattern of the base material. The bath contains 210 g/L of copper sulfate, 3.2% by volume of sulfuric acid, 50 ppm of cupric chloride, 0.16% by volume of conventional carrier/brightener/leveler, and 0.6% by volume of a conventional brightener/leveler support additive.

After plating, the sample is examined and the adhesion of the metal deposit will be found to be excellent.

What is claimed is:

1. An electroless plating process comprising the steps of:

a) preparing a surface of a non-conductive substrate by treatment of such surface with alkaline permanganate or by plasma desmearing;

b) contacting the prepared surface resulting from step a) with a stabilized sensitizing solution comprising (i) ions of a metal selected from the group consisting of Group VIII and IB transition metals, (ii) stannous ions present in the solution in a molar concentration in excess of the concentration of said metal ions, (iii) an acid and (iv) a buffering salt;

c) contacting the sensitized surface resulting from step b) with a solution containing a noble metal to thereby catalyze the surface for subsequent electroless metal plating;

d) contacting the surface resulting from step c) with an aqueous acidic electroless nickel metal depositing solution to thereby prepare the surface for subsequent pattern electroplating, said aqueous acidic electroless nickel metal depositing solution comprising (i) nickel ions, (ii) a complexing agent (iii) a reducing agent capable of reducing the nickel ions to nickel metal in an acidic state, provided said reducing agent does not contain any formaldehyde or formaldehyde-generating composition and (iv) one or more stabilizers.

2. A process according to claim 1 wherein the sensitizing solution comprises palladium chloride, stannous chloride, hydrochloric acid and sodium chloride as the buffering salt; the noble metal solution comprises palladium chloride and hydrochloric acid; the complexing agent comprises sodium acetate or succinic acid; the reducing agent comprises sodium borohydride or dimethylborane; and the stabilizer is lead acetate.

3. A process as claimed in claim 1 wherein step a) is carried out by treatment of the surface with an alkaline permanganate solution having a pH above about 10 and comprising potassium permanganate and sodium hydroxide and the treatment is carried out by immersing the surface in the alkaline permanganate solution at a temperature ranging between about 165° F. and about 200° F. and the immersion in the alkaline permanganate solution is maintained for a period of about 8 to about 16 minutes.

4. A process for preparing a printed circuit board comprising the steps of:
 a) drilling a least one through-hole through a board comprising a non-conductive substrate, deburring and desmearing said through-hole and cleaning and conditioning said through-hole and at least one surface of said substrate;
 b) contacting the cleaned and conditioned board resulting from step a) with a stabilized sensitizing solution comprising (i) ions of a metal selected from the group consisting of Group VIII and IB transition metals, (ii) stannous ions present in the solution in a molar concentration in excess of the concentration of said metal ions, (iii) an acid and (iv) a buffering salt;
 c) contacting the sensitized board resulting from step b) with a solution containing a noble metal to thereby catalyze the board for subsequent electroless metal plating;
 d) contacting the board resulting from step c) with a dry film photoresist, imaging the resulting board with a pattern corresponding to a desired circuit pattern and developing the imaged board;
 e) contacting the developed, imaged board resulting from step d) with an acidic cleaning solution; and
 f) immersing the board resulting from step e) in an aqueous acidic electroless nickel metal depositing solution, for a time, at a concentration and at a temperature sufficient to prepare the board for subsequent pattern electroplating, said aqueous acidic electroless nickel metal depositing solution comprising (i) nickel ions, (ii) a complexing agent (iii) a reducing agent capable of reducing the nickel ions to nickel metal in an acidic state, provided said reducing agent does not contain any formaldehyde or formaldehyde-generating composition and (iv) one or more stabilizers.

5. A process according to claim 4 wherein the cleaning and conditioning of the through-hole and the surface of the board is accomplished by treatment with a glycol ether; the sensitizing solution comprises palladium chloride, stannous chloride, hydrochloric acid and sodium chloride as the buffering salt; the noble metal solution comprises palladium chloride and hydrochloric acid; the complexing agent comprises sodium acetate or succinic acid; the reducing agent comprises sodium borohydride or dimethylborane; the stabilizer is lead acetate; and the acidic cleaning solution comprises sulfuric acid.

6. An electroless plating process comprising the steps of:
 a) contacting a surface of a non-conductive substrate with a cleaning and conditioning composition comprising at least one glycol ether;
 b) treating the cleaned and conditioned surface resulting from step a) with an alkaline permanganate solution for a time, at a concentration, and at an elevated temperature sufficient to prepare such surface for a metal lay to be subsequently applied by electroplating;
 c) contacting the surface resulting from step b) with an aqueous neutralizing and conditioning solution comprising water, hydrogen peroxide, at least one acid sulfate compound and at least one cationic surfactant;
 d) contacting the surface resulting from step c) with a stabilized sensitizing solution comprising (i) ions of a metal selected from the group consisting of Group VIII and IB transition metals, (ii) stannous ions present in the solution in a molar concentration in excess of the concentration of said metal ions, (iii) an acid and (iv) a buffering salt;
 e) contacting the sensitized surface resulting from step d) with a solution containing a noble metal salt to thereby catalyze the surface for subsequent electroless metal plating;
 f) contacting the board resulting from step e) with a dry film photoresist, imaging the resulting board with a pattern corresponding to a desired circuit pattern and developing the imaged board;
 g) contacting the developed, imaged board resulting from step f) with an acidic cleaning solution; and
 h) immersing the board resulting from step g) in an aqueous acidic electroless nickel metal depositing solution, for a time, at a concentration and at a temperature sufficient to prepare the board for subsequent pattern electroplating, said aqueous acidic electroless nickel metal depositing solution comprising (i) nickel ions, (ii) a complexing agent (iii) a reducing agent capable of reducing the nickel ions to nickel metal in an acidic state, provided said reducing agent does not contain any formaldehyde or formaldehyde-generating composition and (iv) one or more stabilizers.

7. A process according to claim 6 wherein the metal selected from the group consisting of Group VIII and IB transition metals is selected from the group consisting of manganese, iron, cobalt, nickel, copper, palladium, platinum, silver and gold; the sensitizing solution comprises palladium chloride, stannous chloride, hydrochloric acid and sodium chloride as the buffering salt; the noble metal solution comprises palladium chloride and hydrochloric acid; the complexing agent comprises sodium acetate or succinic acid; the reducing agent comprises sodium borohydride or dimethylborane; the stabilizer is lead acetate; and the acidic cleaning solution comprises sulfuric acid.

8. A process according to claim 6 wherein the aqueous neutralizing and conditioning solution consists essentially of water, hydrogen peroxide, sodium bisulfate and a multifunctional ionic copolymer with at least two available cationic functional moieties selected from quaternary phosphonium and quaternary ammonium groups, and step c) is carried out at a temperature of about 60° to about 110° F. at a time of contact between the surface and the solution ranging from about 1 to about 3 minutes.

9. A process according to claim 6 wherein the sensitizing solution consists essentially of stannous chloride, sodium chloride, palladium chloride and water.

10. A process according to claim 6 wherein the noble metal salt consists essentially of a salt of a metal selected from the group consisting of palladium, platinum, silver and gold, and step e) is carried out at a temperature of about 70° to about 90° F. for a period of time of about 0.75 to about 1.5 minutes.

11. An electroless plating process comprising the steps of:
a) preparing a surface of a non-conductive substrate by subjecting such surface to plasma desmearing;
b) contacting the prepared surface resulting from step a) with a glass etching solution comprising hydrofluoric acid;
c) contacting the surface resulting from step b) with an aqueous conditioning solution comprising hydrogen peroxide and at least one cationic surfactant;
d) contacting the surface resulting from step c) with a microetching solution consisting essentially of sulfuric acid, hydrofluoric acid and acetone;
e) contacting the surface resulting from step d) with a stabilized sensitizing solution comprising (i) ions of a metal selected from the group consisting of Group VIII and IB transition metals, (ii) stannous ions present in the solution in a molar concentration in excess of the concentration of said metal ions and (iii) hydrochloric acid;
f) contacting the sensitized surface resulting from step e) with a solution containing a noble metal salt to thereby catalyze the surface for subsequent electroless metal plating;
g) contacting the surface resulting from step f) with a dry film photoresist, imaging the resulting surface with a pattern corresponding to a desired circuit pattern and developing the imaged surface;
h) contacting the developed, imaged surface resulting from step g) with an acidic cleaning solution; and
i) immersing the surface resulting from step h) in an aqueous acidic electroless nickel metal depositing solution, for a time, at a concentration and at a temperature sufficient to prepare the surface for subsequent pattern electroplating, said aqueous acidic electroless nickel metal depositing solution comprising (i) nickel ions, (ii) a complexing agent (iii) a reducing agent capable of reducing the nickel ions to nickel metal in an acidic state, provided said reducing agent does not contain any formaldehyde or formaldehyde-generating composition and (iv) one or more stabilizers.

12. A process as claimed in claim 11 including the additional steps of:
j) contacting the surface resulting from step i) with an acidic solution to provide pH stability and compatibility with the next step k); and
k) electroplating the surface resulting from step k) by electrolytically depositing one or more metal layers thereon.

13. A process as claimed in claim 12 wherein the acidic solution consists essentially of an acid selected from the group consisting of sulfuric acid, chromic acid, hydrochloric acid, hydrofluoric acid and nitric acid, and step j) is carried out at a temperature of about 70° to about 100° F. for a contract time in the range of about 0.75 to about 1.5 minutes.

14. A process as claimed in claim 13 wherein the acidic solution comprises a solution containing about 5 to about 20 volume percent of sulfuric acid.

* * * * *